(12) United States Patent
Hashimoto et al.

(10) Patent No.: US 9,800,257 B2
(45) Date of Patent: Oct. 24, 2017

(54) PHOTOELECTRIC CONVERSION APPARATUS AND IMAGE CAPTURING SYSTEM

(71) Applicant: CANON KABUSHIKI KAISHA, Tokyo (JP)

(72) Inventors: Seiji Hashimoto, Yokohama (JP); Daisuke Yoshida, Ebina (JP); Makoto Ise, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 76 days.

(21) Appl. No.: 14/630,503

(22) Filed: Feb. 24, 2015

(65) Prior Publication Data

US 2015/0244388 A1    Aug. 27, 2015

(30) Foreign Application Priority Data

Feb. 26, 2014  (JP) ................. 2014-035848

(51) Int. Cl.
| | |
|---|---|
| *H03M 1/34* | (2006.01) |
| *H04N 5/378* | (2011.01) |
| *H03M 1/18* | (2006.01) |
| *H04N 5/235* | (2006.01) |
| *H03M 1/12* | (2006.01) |
| *H03M 1/56* | (2006.01) |

(52) U.S. Cl.
CPC ............. *H03M 1/34* (2013.01); *H03M 1/186* (2013.01); *H04N 5/235* (2013.01); *H04N 5/378* (2013.01); *H03M 1/123* (2013.01); *H03M 1/56* (2013.01)

(58) Field of Classification Search
CPC ..... H04N 5/378; H04N 5/374; H04N 5/37455
USPC .................................................. 348/322, 302
See application file for complete search history.

(56) References Cited

U.S. PATENT DOCUMENTS

| | | | | |
|---|---|---|---|---|
| 2009/0109315 A1* | 4/2009 | Taura | ...................... | H04N 5/378 348/311 |
| 2010/0039306 A1* | 2/2010 | Simony | .................. | H03M 1/182 341/156 |
| 2010/0253821 A1* | 10/2010 | Yamamoto | ............... | H03K 4/02 348/294 |
| 2012/0008028 A1* | 1/2012 | Egawa | ................... | H04N 5/378 348/300 |
| 2012/0327279 A1* | 12/2012 | Hashimoto | ............ | H04N 5/357 348/300 |
| 2014/0175263 A1* | 6/2014 | Muto | .................. | H04N 5/35527 250/208.1 |
| 2015/0222831 A1* | 8/2015 | Hashimoto | ............ | H04N 5/353 348/301 |

FOREIGN PATENT DOCUMENTS

| | | | |
|---|---|---|---|
| CN | 102843528 A | 12/2012 | |
| CN | 103002232 A | 3/2013 | |

(Continued)

*Primary Examiner* — Antoinette Spinks
(74) *Attorney, Agent, or Firm* — Canon USA, Inc., IP Division

(57) ABSTRACT

In a first sensitivity level, an AD converter performs AD conversion selectively using, in accordance with the level of the analog signal, any one of a first reference signal and a second reference signal that have mutually different slopes, and in a second sensitivity level that is different from the first sensitivity level, the AD converter performs AD conversion only using a third reference signal.

17 Claims, 18 Drawing Sheets

(56) References Cited

FOREIGN PATENT DOCUMENTS

| | | | |
|---|---|---|---|
| CN | 103379297 | A | 10/2013 |
| EP | 2645575 | A2 | 10/2013 |
| JP | 2009-177797 | A | 8/2009 |
| JP | 2010-045789 | A | 2/2010 |

* cited by examiner

FIG. 7A
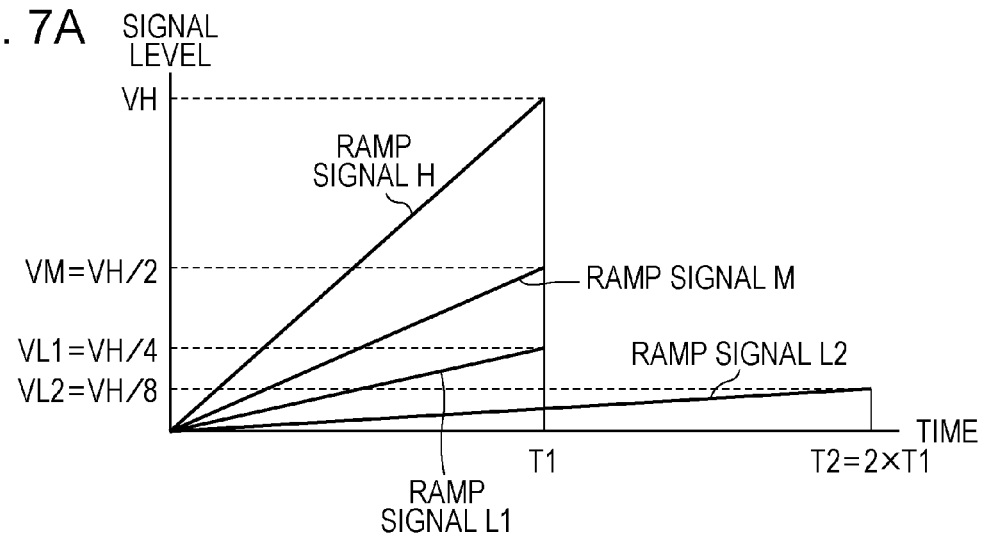
FIG. 7B
| ISO SPEED | RAMP SIGNAL | | | |
|---|---|---|---|---|
| | H | M | L1 | L2 |
| 100 | ○ | | | |
| 200 | ○ | ○ | | |
| 400 | | ○ | ○ | |
| 800 | | ○ | | ○ |
FIG. 7C
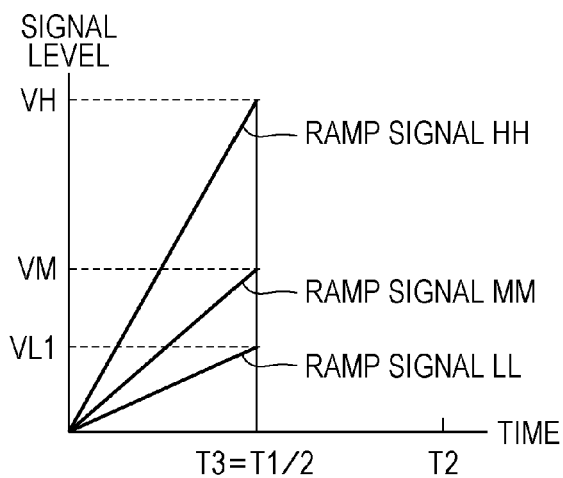

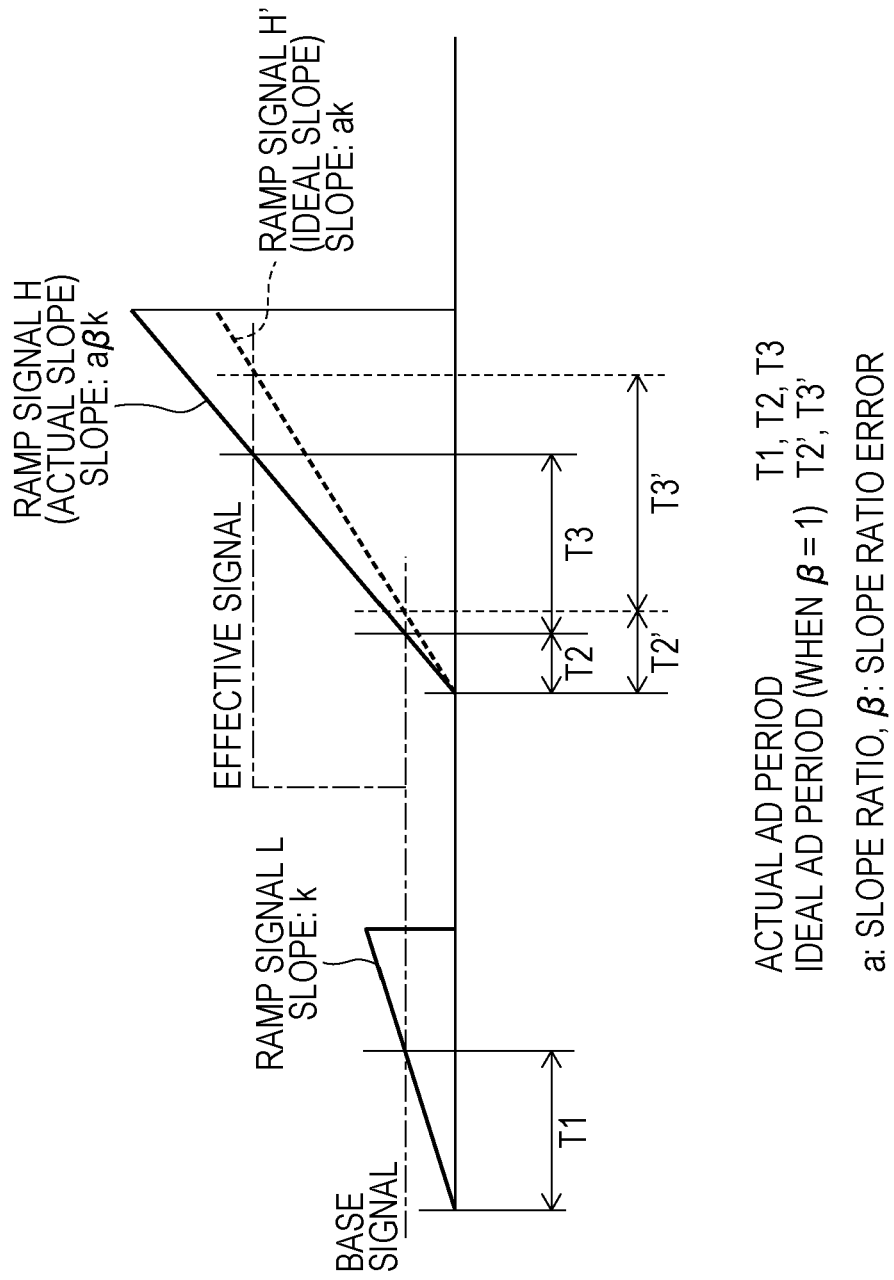

PHOTOELECTRIC CONVERSION APPARATUS AND IMAGE CAPTURING SYSTEM

BACKGROUND OF THE INVENTION

Field of the Invention

One disclosed aspect of the embodiments relates to a photoelectric conversion apparatus and an image capturing system. In particular, an embodiment relates to a photoelectric conversion apparatus and an image capturing system provided with an AD converter.

Description of the Related Art

An image capturing apparatus provided with an AD converter has been proposed.

Japanese Patent Laid-Open No. 2009-177797 discloses AD conversion of a ramp-based approximation method in which a reference signal of which signal level changes with time and an analog signal are compared to obtain a digital signal. It is also disclosed that changing a rate of change of the reference signal with time may change a gain in AD conversion.

In Japanese Patent Laid-Open No. 2010-045789 discloses an image sensor that compares an analog signal with a threshold obtained by dividing an amplitude of a full-scale analog signal by $2^k$. In this related art, if an analog signal is larger than a threshold, the analog signal is compared with a reference signal having a relatively large rate of change to obtain n-bit digital data on the MSB side. If the analog signal is equal to or smaller than the threshold, the analog signal is compared with a reference signal having a relatively small rate of change to obtain n-bit digital data on the LSB side.

SUMMARY OF THE INVENTION

In an aspect of the embodiments, a photoelectric conversion apparatus in which sensitivity levels is settable, or can be set, includes: a plurality of analog signal output units including a plurality of pixels and configured to output an analog signal in accordance with a signal produced in the plurality of pixels; and a plurality of analog-to-digital (AD) converters provided to correspond to the plurality of analog signal output units and configured to perform AD conversion by comparing a ramp signal with the analog signal output from the analog signal output units, wherein in a first sensitivity level, each of the plurality of AD converters performs AD conversion selectively using, in accordance with a level of the analog signal, any one of a first ramp signal and a second ramp signal that have mutually different slopes, and in a second sensitivity level that is different from the first sensitivity level, each of the AD converters uses only a third ramp signal as the ramp signal for performing the AD conversion.

In another aspect of the embodiments, a photoelectric conversion apparatus in which sensitivity levels is settable, includes: a plurality of analog signal output units including a plurality of pixels and configured to output an analog signal in accordance with a signal produced in the plurality of pixels; and a plurality of AD converters provided to correspond to the plurality of analog signal output units and configured to perform AD conversion by comparing a ramp signal with the analog signal output from the analog signal output units, wherein in a first sensitivity level, each of the plurality of AD converters performs AD conversion selectively using, in accordance with the size of the analog signal, any one of a first ramp signal and a second ramp signal that have mutually different slopes, and in a second sensitivity level that is different from the first sensitivity level, each of the plurality of AD converters performs AD conversion selectively using, in accordance with the size of the analog signal, any one of a third ramp signal and a fourth ramp signal that have mutually different slopes, and the fourth ramp signal has a different slope from those of the first ramp signal and the second ramp signal.

In still another aspect of the embodiments, a photoelectric conversion apparatus in which sensitivity levels is settable, includes: a plurality of analog signal output units including a plurality of pixels and configured to output an analog signal in accordance with a signal produced in the plurality of pixels; a plurality of comparators provided to correspond to the plurality of analog signal output units; and a ramp signal supply unit, wherein in a first sensitivity level, the ramp signal supply unit selectively inputs, in the comparator, any one of the first ramp signal and the second ramp signal that have mutually different slopes in accordance with the size of the analog signal input in the comparator, and the comparator performs AD conversion by comparing the analog signal and the selectively input one of the first and second ramp signals and, in a second sensitivity level, the ramp signal supply unit inputs only a third ramp signal in the comparator, and the comparator performs AD conversion by comparing the analog signal with the third ramp signal.

In still another aspect of the embodiments, a photoelectric conversion apparatus in which sensitivity levels is settable, includes: a plurality of analog signal output units including a plurality of pixels and configured to output an analog signal in accordance with a signal produced in the plurality of pixels; and a plurality of comparators provided to correspond to the plurality of analog signal output units; and a ramp signal supply unit, wherein in a first sensitivity level, the ramp signal supply unit selectively inputs, in the comparator, any one of the first ramp signal and the second ramp signal that have mutually different slopes in accordance with the size of the analog signal input in the comparator, and the comparator performs AD conversion by comparing the analog signal and the selectively input one of the first and second ramp signals and, in a second sensitivity level that is different from the first sensitivity level, the ramp signal supply unit selectively inputs, in the comparator, any one of the third ramp signal and the fourth ramp signal that have mutually different slopes in accordance with the size of the analog signal input in the comparator, and the comparator performs AD conversion by comparing the analog signal and the selectively input one of the third ramp signal and the fourth ramp signal and, the fourth ramp signal differs from the first ramp signal and the second ramp signal.

Further features of the disclosure will become apparent from the following description of exemplary embodiments with reference to the attached drawings.

BRIEF DESCRIPTION OF THE DRAWINGS

FIGS. 7A to 7C are diagrams illustrating temporal changes in ramp signals.

FIG. 10 is a diagram illustrating changes in reference signals with time.

DESCRIPTION OF THE EMBODIMENTS

A typical image capturing apparatus has a plurality of sensitivity levels that can be switched depending on imaging conditions. The present inventors have found that, if sensitivity levels are switched using the techniques described in above Japanese Patent Laid-Open Nos. 2009-177797 and 2010-045789, there is a possibility that a dynamic range of a signal that can be AD converted may be narrowed.

The disclosure reduces narrowing of a dynamic range upon switching of sensitivity levels.

To facilitate understanding of the embodiments, problems that may be caused upon switching of sensitivity levels in photoelectric conversion apparatuses of above Japanese Patent Laid-Open Nos. 2009-177797 and 2010-045789 are described.

To change sensitivity levels in a photoelectric conversion apparatus, an amplification factor with respect to a signal may be changed. In AD conversion of a ramp-based approximation method, a range of a signal level that a reference signal may take in an AD conversion period in which AD conversion is performed becomes a dynamic range of an AD converter. As described in Japanese Patent Laid-Open No. 2009-177797, when an amplification factor with respect to a signal is changed by changing a rate of change of a reference signal, i.e., a slope to time, a dynamic range of an AD converter becomes narrower as an amplification factor is made larger, i.e., a rate of change of the reference signal is made smaller. In other words, the dynamic range of the AD converter becomes narrower as the sensitivity levels are set higher.

Also in the configuration described in Japanese Patent Laid-Open No. 2010-045789, if a slope of the reference signal is changed to change sensitivity levels of a photoelectric conversion apparatus, a dynamic range of an AD converter becomes narrower as the sensitivity levels are set higher as in Japanese Patent Laid-Open No. 2009-177797.

In light of the above problems, in the embodiment described below, regarding at least one sensitivity level among a plurality of sensitivity levels, a reference signal is selected, in accordance with the size of the analog signal to be AD converted, from among a plurality of reference signals having different slopes. Regarding other sensitivity levels, AD conversion is performed using one reference signal regardless of the size of the analog signal or a plurality of reference signals of combinations that are different from the plurality of reference signals used in above-described one sensitivity level are selected in accordance with the size of the analog signal.

Hereinafter, various embodiments of the disclosure are described.

First Embodiment

Figure 1:
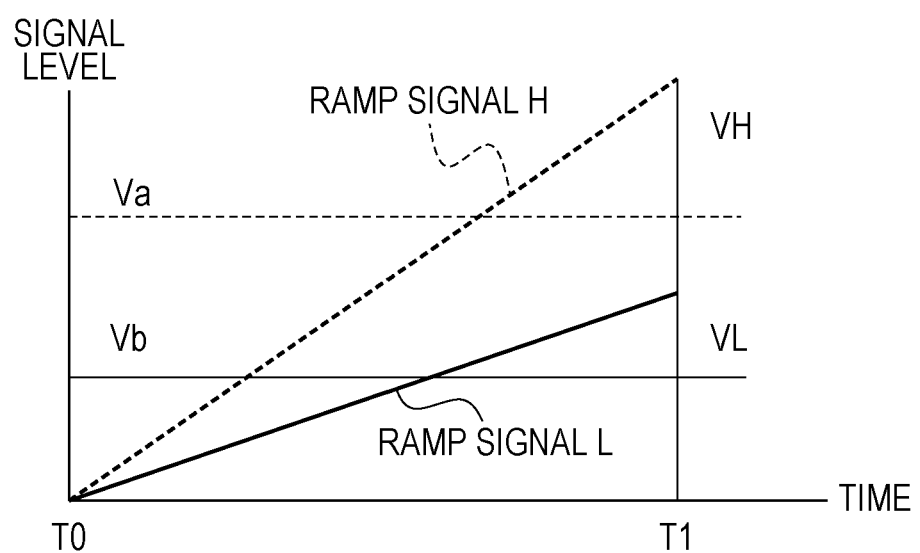
FIG. 1 is a diagram illustrating a relationship between an analog signal and a reference signal compared by an AD converter.

FIG. 1 is a diagram illustrating a relationship between an analog signal and a reference signal compared by an AD converter. Time is plotted on the horizontal axis and a signal level is plotted on the vertical axis. A ramp signal H and a ramp signal L, which are the reference signals, are plotted. The maximum value of the ramp signal H is VH. Analog signals having signal levels of 0 to VH may be AD converted by using the ramp signal H. The maximum value of the signal level of the ramp signal L is VL, which is lower than VH. Thus, when the signal level of the analog signal is higher than VL, that signal cannot be AD converted. This means that, when the ramp signal L is used, as compared with case in which the ramp H is used, the dynamic range of the AD converter is narrowed. If the analog signal is smaller than VL, the ramp signal L is used and, if the analog signal is greater than VL, the ramp signal H is used. Thus, the dynamic range of the AD converter may be extended while keeping high resolution for signals of relatively low luminance.

Figure 2:
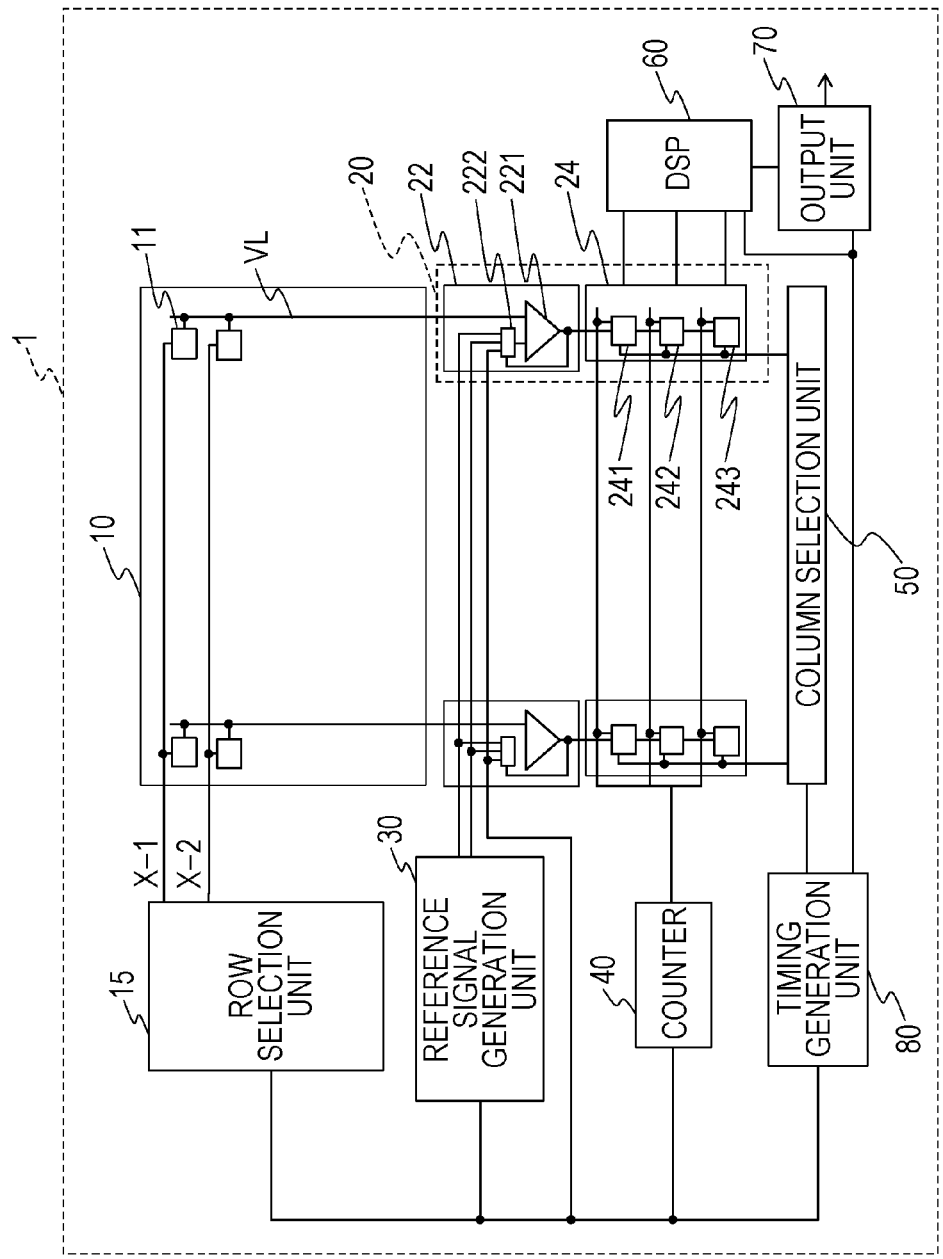
FIG. 2 is a diagram illustrating an exemplary configuration of a photoelectric conversion apparatus.

FIG. 2 is a diagram illustrating an exemplary configuration of a photoelectric conversion apparatus according to the present embodiment.

A photoelectric conversion apparatus 1 may selectively set a plurality of sensitivity levels, and is provided with a pixel array 10, a row selection unit 15, a column signal processing unit 20, a reference signal generation unit 30, a counter 40, a column selection unit 50, a digital signal processor (DSP) 60, and an output unit 70.

The pixel array 10 includes a plurality of pixels 11 arranged in a matrix. In FIG. 2, the pixels 11 are arranged in two rows and two columns. In the present embodiment, the pixel array 10 functions as an analog signal output unit.

The column signal processing unit 20 is provided to correspond to the columns of the pixel array 10, and is provided with a comparison unit 22 and a memory unit 24. The comparison unit 22 is provided with a comparator 221 and a selection circuit 222. A signal output from the pixel array 10 is input in corresponding one of input terminals of the comparator 221. A signal output from the reference signal generation unit 30 is input in the other of the input terminals of the comparator 221 via the selection circuit 222. The reference signal generation unit 30 outputs a signal used as a threshold, and a reference signal of which signal level changes with time. The selection circuit 222 has a function as a ramp signal supply unit, selects either of the signals output from the reference signal generation unit 30, and supplies the selected signal to the other of the input terminals of the comparator 221.

The counter 40 outputs a count signal by counting clock signals supplied, for example, from an unillustrated timing control unit.

The memory unit 24 is provided with a flag memory 241, an S memory 242, and an N memory 243. The flag memory 241 stores a flag signal, which is described later. The S memory 242 and the N memory 243 store count signals supplied from the counter 40 in accordance with the output of the comparator 221, i.e., in accordance with the change in the magnitude relationship between the analog signal and the reference signal.

The column selection unit 50 selects a memory unit 24. A signal stored in the selected memory unit 24 is then transferred to the DSP 60.

The DSP 60 corrects the signal in accordance with a flag signal. The DSP 60 may perform difference processing between a signal stored in the S memory 242 and a signal stored in the N memory 243.

The output unit 70 outputs a signal output from the DSP 60. The output unit 70 may have a buffer function.

The timing generation unit 80 supplies a signal about an operation of the photoelectric conversion apparatus 1.

Figure 3:
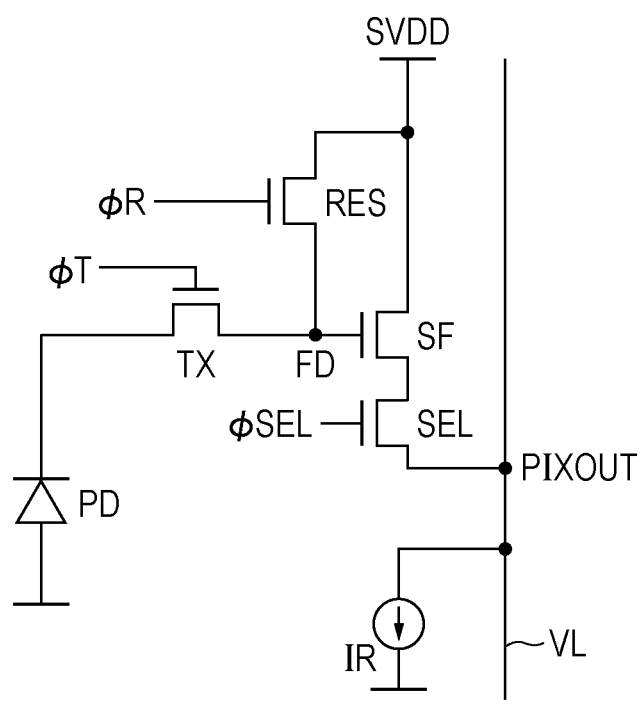
FIG. 3 is a diagram illustrating an exemplary configuration of a pixel.

FIG. 3 illustrates an exemplary configuration of a pixel 11 according to the present embodiment. The pixel 11 is provided with a photodiode PD, an amplifying transistor SF, a transfer transistor TX, a reset transistor RES, and a selection transistor SEL. The transfer transistor TX, the reset transistor RES, and the selection transistor SEL are switched between an electrically connecting state and a non-electrically connecting state by a signal φT, a signal φR, and a signal φSEL, respectively. A ground potential is provided to an anode of the photodiode PD. A cathode of the photodiode PD is connected to a floating diffusion unit FD via the transfer transistor TX. A gate of the amplifying transistor SF is connected to the floating diffusion unit FD and is also connected to a power supply SVDD via the reset transistor RES. One of main nodes of the amplifying transistor SF is connected to the power supply SVDD. The other of the main nodes of the amplifying transistor SF is connected to an output node PIXOUT via the selection transistor SEL. When the selection transistor SEL is in an electrically connecting state, the amplifying transistor SF constitutes a source follower circuit together with a current source IR.

Figure 4:
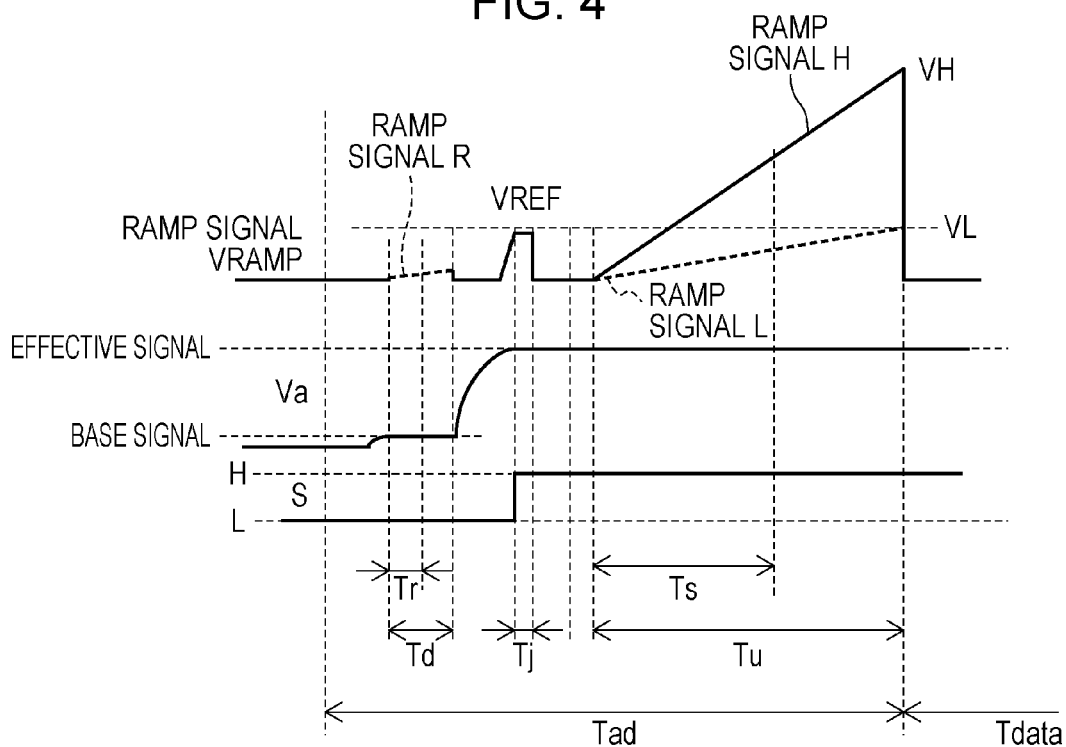
FIG. 4 is a timing chart for explaining an operation.

FIG. 4 is a timing chart for explaining an AD conversion operation according to the present embodiment. FIG. 4 illustrates, regarding a certain column, a ramp signal VRAMP input in the other of the input terminals of the comparator 221, a signal output from the pixel 11, i.e., a signal level Va of one of the input terminals of the comparator 221, and a signal S provided to the selection circuit 222 from the comparator 221.

A period Tad is a period in which an analog signal is AD converted. The signal S is in a low level (hereafter, referred to as an "L level") in the period Tad. Thus, the selection circuit 222 is in a state in which a reference signal of which slope with respect to time is relatively small among the reference signals supplied from the reference signal generation unit 30 may be provided.

In the pixel 11, when a gate of the amplifying transistor SF is reset by the reset transistor RES, the pixel 11 outputs a base signal. The base signal includes a noise component accompanying the reset. After the output of the pixel 11 is stabilized in the base signal, a ramp signal R is supplied to the comparator 221 in a period Td. The period Td is a period in which the base signal is AD converted. A signal level of the ramp signal R starts changing with a first slope with time and, at the same time, the counter 40 starts counting. When the ramp signal R exceeds the base signal after a lapse of time Tr since the start of the period Td, the output of the comparator 221 changes and, thereby, the count signal output from the counter 40 is stored in the N memory 243.

After the period Td ends, when the charge accumulated in the photodiode PD of the pixel 11 is transferred to the gate of the amplifying transistor SF via the transfer transistor TX, the pixel 11 outputs an effective signal. The effective signal is a signal of which component equivalent to an amount of charge accumulated in the photodiode PD is superimposed on the base signal.

A period Tj is a period in which determination is made. In the period Tj, a comparison voltage VREF, which is a threshold, is provided to the comparator 221. The comparator 221 compares the effective signal with the comparison voltage VREF in the period Tj. If the effective signal is greater than the comparison voltage VREF, the comparator 221 makes the selection circuit 222 output an H level signal and store, in the flag memory 241, a flag signal indicating that the effective signal is greater than the comparison voltage VREF. If the effective signal is smaller than the comparison voltage VREF, the comparator 221 makes the selection circuit 222 output an L level signal and store, in the flag memory 241, a flag signal indicating that the effective signal is smaller than the comparison voltage VREF.

The period Tu is a period in which the effective signal is AD converted. In the period Tu, a slope of the reference signal supplied to the comparator 221 differs depending on the output of the selection circuit 222. If the output of the selection circuit 222 is on the H level, i.e., if the effective signal is greater than the comparison voltage VREF, a ramp signal H of which slope with respect to time is relatively large is supplied to the comparator 221. This case is illustrated by a solid line in FIG. 4. If the output of the selection circuit 222 is on the L level, i.e., if the effective signal is smaller than the comparison voltage VREF, a ramp signal L of which slope with respect to time is relatively small is supplied to the comparator 221. This case is illustrated by a dotted line in FIG. 4. A signal level of the ramp signal H, which is a second reference signal, starts changing with a second slope with respect to time and, at the same time, the counter 40 starts counting. When the ramp signal H exceeds the base signal after a lapse of time Ts since the start of the period Tu, the output of the comparator 221 changes and, thereby, the count signal output from the counter 40 is stored in the S memory 242. Hereafter, the ramp signal L is referred also to as a first ramp signal and the ramp signal H is referred also to as a second ramp signal. In the present embodiment, when AD conversion of the effective signal is performed using the ramp signal H, an operation frequency of the counter 40 is set to ½ of the operation frequency in the case in which AD conversion of the effective signal is performed using a ramp signal L, which is the first reference signal. With this configuration, if an analog signal is greater than a threshold, the analog signal is converted into a digital signal having a number of bits that are smaller than those of a case in which an analog signal is smaller than the threshold. Thus, power consumption can be reduced. When the ramp signal L is used, a p-bit digital signal is obtained. When the ramp signal H is used, a q-bit digital signal that is smaller than p-bit is obtained.

Figure 5:
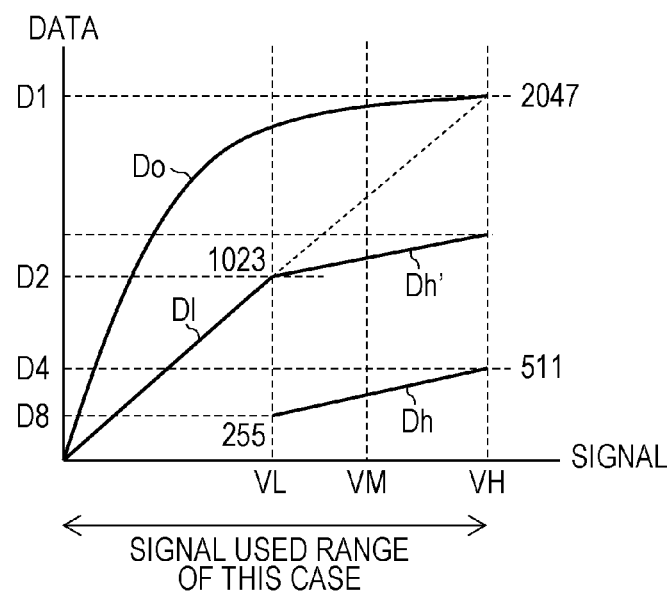
FIG. 5 is a diagram illustrating a relationship between a signal amplitude of an analog signal and digital data.

FIG. 5 is a diagram illustrating a relationship between a signal amplitude of an analog signal and digital data. An amplitude of the analog signal is plotted on the horizontal axis. The amplitude of the analog signal corresponds to a light quantity entering the photodiode. A value of a digital signal after AD conversion is plotted on the vertical axis. Here, suppose that D1=2047 (=$10^{11}$−1) is a full scale of the digital value.

In FIG. 5, if the analog signal is in a range to VL, the analog signal is converted into 10-bit (=$10^{10}$=1024 stages) digital signal using the ramp signal L. If the analog signal exceeds VL, the analog signal is converted into a digital signal using the ramp signal H. Here, in the present embodiment, the operation frequency of the counter 40 is reduced to ½ as that of the case in which the ramp signal L is used. In addition, since the slope of the ramp signal H with respect to time is twice as large as the slope of the ramp signal L with respect to time, the slope of the digital signal with respect to the analog signal in the range of VL to VH is ¼ of that in the range in which the analog signal is 0 to VL. Therefore, the digital signal obtained by converting the analog signal using the ramp signal H is D8 (=255=(1024/4)−1) to D4 (=511=(2048/4)−1). This value corresponds to ¼ of the value of the digital signal obtained when an analog signal in the range of VL to VH is AD converted using the ramp signal L. When an image is to be formed based on the obtained digital signal, 1023-255=768 is added to a signal of Dh and, therefore, in the image, the signal is treated as a signal corresponding to Dh'. Characteristics illustrated by Do are obtained by performing gamma processing to signals of which characteristics are illustrated by DI and Dh'.

In the technique described in Japanese Patent Laid-Open No. 2010-045789, when an analog signal is AD converted using a reference signal having a relatively large slope, a digital signal of the same number of bits as that of the case in which an analog signal is AD converted using a reference signal having a relatively small slope is obtained. Therefore, this case is applied to FIG. 5, an analog signal in the range of VL to VH is converted into 10-bit data in a range of data D2 (1023) to data D1 (2047). However, if 10-bit data is obtained in this range, if is considered that power consumption is large.

In the present embodiment, a low luminance component is converted into 10-bit data and a high luminance component is converted as a compressed signal with low power consumption. Since a change in luminance of the low luminance component is highly visible to human eyes, the low luminance component is important in an image. On the other hand, since a change in luminance of the high luminance component is not highly visible to human eyes as compared with the low luminance component, compression of the high luminance component does not easily cause problems.

According to the present embodiment, power consumption can be reduced as described above.

In the foregoing, a case in which an analog signal is greater than a threshold and a case in which an analog signal is smaller than a threshold are described, and a case in which an analog signal is equal to a threshold is not described in order to facilitate understanding. If an analog signal is equal to a threshold, it is only necessary to perform either the process for the case in which an analog signal is greater than a threshold or the process for the case in which an analog signal is smaller than a threshold.

In FIG. 4, three ramp signals R, L and H are described as reference signals. Among these, the ramp signal R and the ramp signal L are used to convert an analog signal of low amplitude and, therefore, may have the same temporal change rate. If the ramp signal R and the ramp signal L have the same temporal change rate, the number of wires that supply the reference signal can be reduced. Alternatively, the selection circuit 222 of each column may be provided with a circuit for changing the temporal change rate of the ramp signal, and each selection circuit may generate the ramp signal R, L and H. In that case, the number of wires connected to the selection circuit 222 of each column from the reference signal generation unit 30 can further be reduced. The ramp signal H changes with a second slope that is higher than a first slope with respect to the ramp signals R and L that change with the first slope.

A main component of the base signal converted using the ramp signal R is noise and, therefore, its signal level is not high. Then, the maximum value that the ramp signal R can take may be set to be lower than the maximum value that the ramp signal L can take. Therefore, the length of the period Td in which the base signal is AD converted can be shortened.

The comparison voltage VREF as a threshold used to determine a signal level of an effective signal may be a fixed voltage that is supplied, or may be generated by stopping the temporal change of the ramp signal when the signal level of the ramp signal reaches a threshold. The comparison voltage VREF may be equal to the maximum value VL that the ramp signal L can take, but it is desirable that the comparison voltage VREF it is smaller than the maximum value VL that the ramp signal L can take. It is because each comparator 221 has an offset, so there is a possibility that the offset prevents correct determination unless the comparison voltage VREF is set sufficiently higher than VL. Therefore, it is desirable to set the comparison voltage VREF to be a signal level sufficiently lower than the maximum value VL of the ramp signal L in consideration of the offset variation of each comparator 221.

In the foregoing, converting the digital signal Dh into Dh' and performing gamma processing are described with reference to FIG. 5. These processes are executed, for example, in the DSP 60. In particular, when a flag signal output from the flag memory 241 indicates that the analog signal has been determined to exceed a threshold, the level of the digital signal Dh is shifted to Dh'.

Figure 6:
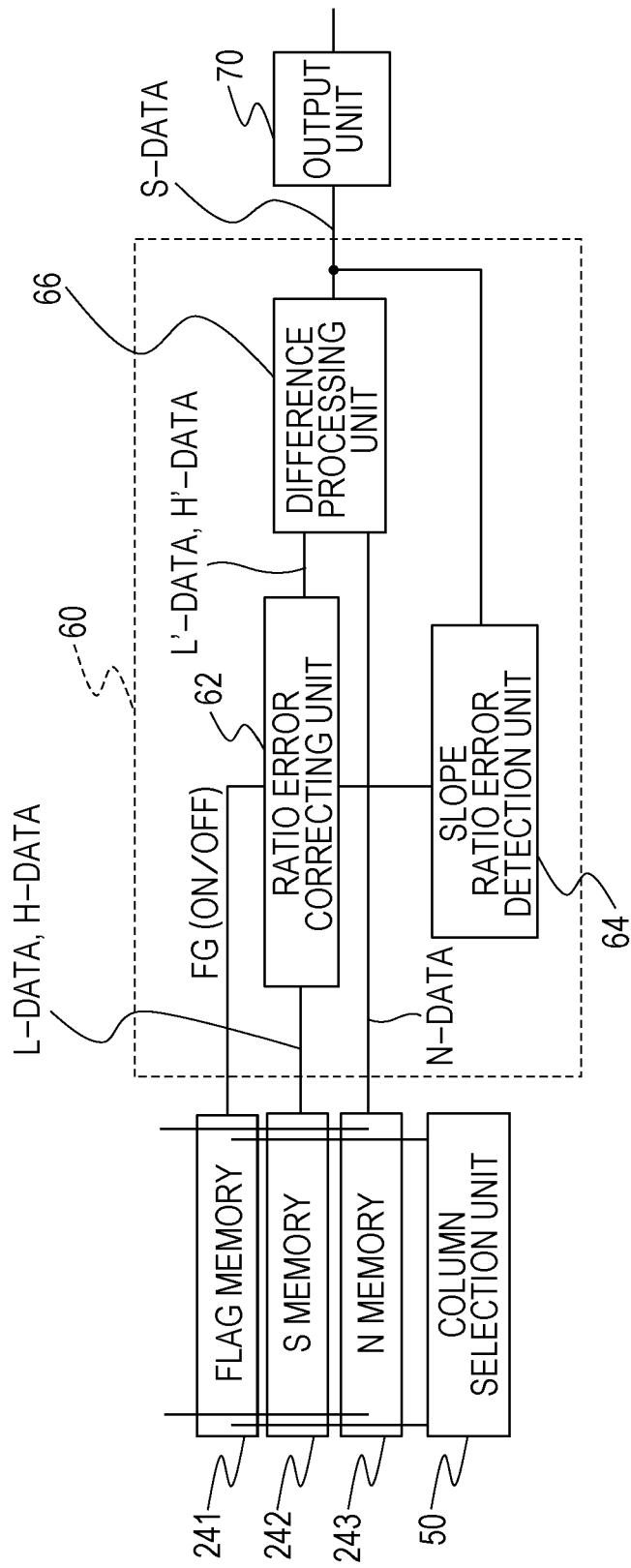
FIG. 6 is a detailed diagram illustrating an exemplary configuration of a digital signal processor (DSP).

A detailed exemplary configuration of the DSP 60 is illustrated in FIG. 6. FIG. 6 is a partial view of FIG. 2 in which the comparison unit 22, the flag memory 241, the S memory 242, the N memory 243, the column selection unit 50, the DSP 60, and an output circuit 70 are illustrated.

The DSP 60 is provided with a gain ratio/slope ratio error correcting unit 62, a slope ratio error detection unit 64, and a difference processing unit 66. The gain ratio/slope ratio error correcting unit 62 identifies which ramp signal has been used in AD conversion of a signal output from the S memory 242 in accordance with a flag signal FG output from the flag memory 241. In accordance with the identification result, the gain ratio/slope ratio error correcting unit 62 corrects the signal output from the S memory 242. Then, a digital signal L-DATA obtained by using the ramp signal L and a digital signal H-DATA obtained by using the ramp signal H become selectively usable state. This operation corresponds to the conversion of the signal Dh into the signal Dh' in FIG. 5.

The slope ratio error detection unit 64 detects a ratio between the temporal change rate of the ramp signal L and the temporal change rate of the ramp signal H, i.e., a slope ratio. In the present embodiment, the temporal change rate of the ramp signal H is twice as high as the temporal change rate of the ramp signal L. However, this ratio is not necessarily applied in actual situations. Then, the slope ratio error detection unit 64 detects a slope ratio between the two ramp signals, i.e., a ratio of the temporal change rates and, in accordance with the detection result, the gain ratio/slope ratio error correcting unit 62 performs correction. The difference processing unit 66 performs a difference process between L'-DATA or H'-DATA output from the gain ratio/slope ratio error correcting unit 62 and N-DATA output from the N memory 243.

It is difficult to manufacture the slope ratio between the ramp signal L and the ramp signal H as design values. An error in the temporal change rate causes a signal step near the signal level VL that is a usage boundary of the ramp signal L and the ramp signal H. The error in the temporal change rate may be measured and then corrected by the later-described DSP. However, such correction is not always necessary because AD conversion using the ramp signal H compresses a high luminance signal and the signal step does not cause any problem in an image.

In the ramp signal L and a ramp signal L8, a step generated near the signal level V8 is significant in the image signal and, therefore, image quality is not impaired when the slope ratio error is corrected. A measurement of the slope ratio error is described later.

Next, a combination of imaging sensitivity levels set in an image capturing system and a ramp signal used in each imaging sensitivity level is described.

FIG. 7A is a diagram illustrating temporal changes of the ramp signals according to the present embodiment. FIG. 7A illustrates four ramp signals H, M, L1 and L2. The maximum values that the ramp signals M, L1, and L2 can take is VM=(VH/2), VL1=(VH/4), and VL2=(VH/8), respectively, with the maximum value that the ramp signal H can take being VH. The ramp signals H, M and L1 reach their maximum values at time T1 whereas the ramp signal L2 reaches the maximum value VL2 at time T2=2-T1.

FIG. 7B is diagram illustrating imaging sensitivity levels set in an image capturing system and ramp signals used in each imaging sensitivity level. Four ISO speeds 100, 200, 400 and 800 as imaging sensitivity levels are arranged in columns. Kinds of ramp signals are arranged in rows. The cells with "O" indicate that ramp signals are used. In particular, in ISO speed 100, only the ramp signal H is used regardless of the level of the analog signal; in ISO speed 200, the ramp signals H and M are used; in ISO speed 400, the ramp signals M and L1 are used; and in ISO speed 800, the ramp signals M and L2 are used.

Since the ISO speed is typically lowered when a high luminance subject is captured, only the ramp signal H is used in ISO speed 100 so that the high luminance signal can also be AD converted. On the other hand, since the ISO speed is set to be higher as the luminance of a subject becomes lower, two kinds of ramp signals are used in ISO speed 200 or higher. When an effective signal is AD converted using two kinds of ramp signals, an operation frequency of the counter 40 in a case of using a ramp signal of high temporal change rate is set to be lower than an operation frequency of a case of using a ramp signal of low temporal change rate. Thus, power consumption can be reduced while extending a dynamic range as in each of the embodiments described above. AD conversion may be performed only using one ramp signal in higher ISO speeds. This means that, in the example of FIG. 7B, in ISO speed 800, the analog signal may be AD converted only using the ramp signal L2 regardless of the level of the analog signal.

Here, ISO speed 200 is referred to as a first sensitivity level and ISO speed 100 is referred to as a second sensitivity level. In ISO speed 200, which is the first sensitivity level, the ramp signal H and the ramp signal M are used selectively. As described with reference to FIG. 4 and other drawings, which of the ramp signal H and ramp signal M is used in AD conversion is determined in accordance with the comparison result of the analog signal and the threshold. In ISO speed 100, which is the second sensitivity level, only the ramp signal H is used regardless of the level of the analog signal. Therefore, since the dynamic range to VH that is the maximum value that the ramp signal H can take can be obtained in both of these sensitivity levels, the dynamic range is not narrowed upon switching of the sensitivity levels of the photoelectric conversion apparatus.

Similarly, if ISO speed 400 is referred to as a first sensitivity level and ISO speed 100 is referred to as a second sensitivity level, a dynamic range in a signal level range of 0 to VM is obtained in the first sensitivity level and a dynamic range of signal level range of 0 to VH is obtained in the second sensitivity level. In the present embodiment, an example in which the ramp signal H is not used in the first sensitivity level is described. This is because it is less possible that high level analog signal is input under the conditions in which high sensitivity levels are used and, therefore, not using the ramp signal H may not cause any problem. Alternatively, a plurality of thresholds used for the comparison with the analog signals may be prepared, and different thresholds may be used for the ramp signal H, M and L1.

The photoelectric conversion apparatus according to the present embodiment may execute the following a) process and b) process to arbitrary two sensitivity levels. a) In one of the sensitivity levels, AD conversion is performed only using one ramp signal and, in the other of the sensitivity levels, AD conversion is performed using one of two ramp signals in accordance with the level of the analog signal. b) In both sensitivity levels, AD conversion is performed using one of two ramp signals in accordance with the level of the analog signal.

In a), the ramp signal used in one of the sensitivity levels may have the same slope as that of the ramp signal used in the other of the sensitivity levels, or may have a different slope from that of the ramp signal used in the other of the sensitivity levels. In b), in both of the sensitivity levels, the used two ramp signals may be a combination of ramp signals having different slopes or Some of the ramp signals may have the same slope.

A slope of a third reference signal, which is a ramp signal used in one of sensitivity levels is described. In a case in which the first sensitivity level is n times (or 1/n times) as high as the second sensitivity level, it is only necessary that the slope of the third reference signal is set to 1/n times (or n times) as large as the slope of the first or the second reference signal, which is the ramp signal used in the other of the sensitivity levels. Especially when n is a value expressed by $2^k$, processing of the signal becomes simple.

FIG. 7C is a diagram illustrating temporal changes of the ramp signals in a case in which power consumption is to be reduced by shortening a change period of the ramp signals without changing an operation frequency of the counter 40 as in a second embodiment described later.

For example, in ISO speed 200, if the effective signal exceeds VM, the ramp signal HH is used and, if the effective signal is smaller than VM, the ramp signal MM is used. Further, for example, in ISO speed 400, if the effective signal is in the range of VL1 to VM, the ramp signal MM is used and, if the effective signal is smaller than VL1, the ramp signal LL is used.

According to the present embodiment, by changing the slope of the used ramp signal, or length of the changing period of the used ramp signal in accordance with the imaging sensitivity level, narrowing of the dynamic range upon switching of the sensitivity levels of the photoelectric conversion apparatus can be reduced.

Second Embodiment

Figure 8:
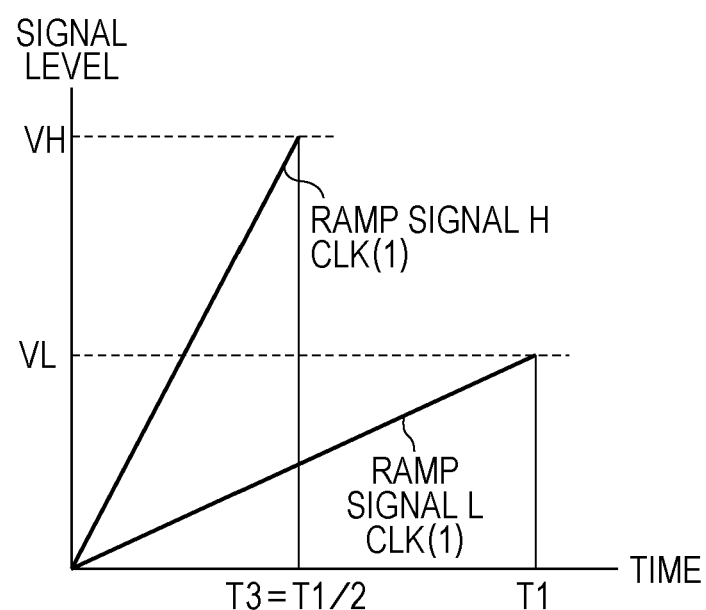
FIG. 8 is a diagram illustrating changes in reference signals with time.

FIG. 8 is a diagram illustrating changes in reference signals with time according to the present embodiment.

In the present embodiment, in a case in which AD conversion is performed using the ramp signal H in the period Tu of FIG. 4, the counter 40 is made to count at the same operation frequency as that in a case in which AD conversion is performed using the ramp signal L. The ramp signal H is made to reach its maximum value VH in a period T3 (=T1/2), which is half of the period that the ramp signal L reaches the maximum value VL.

According to the present embodiment, the period in which AD conversion is performed using the ramp signal H can be shortened and, therefore, power for a driving current of a comparison unit during the shortened period can be saved. Thus, power consumption can be reduced. In a configuration in which a counter is provided in each column, power consumption can be reduced by reducing the frequency of the counter.

Further, power consumption can be reduced by reducing a consumed current in a column amplifier circuit 210 of FIG. 17 which is described later.

Third Embodiment

Figure 9A:
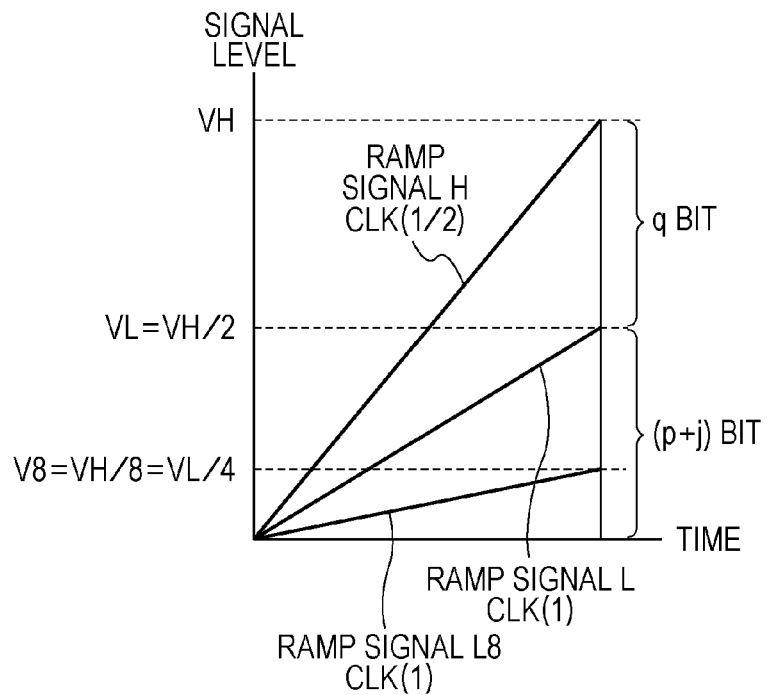
FIGS. 9A and 9B are diagrams illustrating changes in reference signals with time according to the present embodiment.

FIG. 9A is a diagram illustrating changes in reference signals with time according to the present embodiment. Hereinafter, differences from the first embodiment is described mainly.

In the first embodiment, it is described that AD conversion using the ramp signal L and AD conversion using the ramp signal H while making the counter 40 operating at a frequency lower than a case in which the ramp signal L is used are selectively performed in accordance with the signal level of the effective signal. A difference between the present embodiment and the first embodiment is that, in the present embodiment, an effective signal is converted using a ramp signal L8 of which temporal change rate is still lower than that of the ramp signal L with respect to a signal in a signal range (0 to V8, V8 is lower than VL) converted using the ramp signal L in the first embodiment.

In the present embodiment, AD conversion is performed using the ramp signal L8 of which temporal change rate is ¼ as that of the ramp signal L with respect to an effective signal in the range of 0 to V8=VH/8. At this time, the operation frequency of the counter 40 is the same as in the case in which the ramp signal L is used.

The maximum value of the ramp signal H is VH and VL is VL=VH/2. That is, VL=VH·(½$^h$) where h=1. V8 is V8=VH/8={VH·(½$^h$)}·(½$^j$)=VL·(½$^j$) where j=2. Here, a description is made with reference to a case in which the maximum value of an analog signal that can be converted by the AD converter is VH.

Therefore, when it is assumed that the counter 40 outputs a p-bit count signal, if an effective signal is AD converted using the ramp signal L8, a p-bit digital signal is obtained. Also when an effective signal is AD converted using the ramp signal L, a p-bit digital signal is obtained. The digital signal obtained using the ramp signal L8 is treated as p bits on the LSB side and the digital signal obtained using the ramp signal L is treated as p bits on the MSB side. Therefore, multiplying the p-bit digital signal on the MSB side by $2^j$ is equivalent to performing AD conversion of an effective signal in a range of 0 to VL with a resolution of (p+j) bits. That is, signals in a range with low signal level can be AD converted with high resolution.

When AD conversion is performed using the ramp signal H, AD conversion at q bits that is smaller than p bits is performed.

Figure 9B:
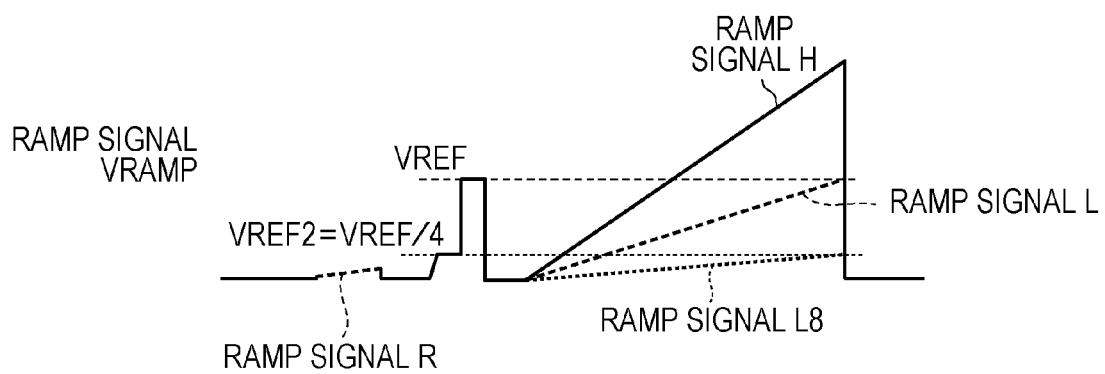

An operation according to the present embodiment differs from the operation illustrated in FIG. 4 in the ramp signal VRAMP and output S of the selection circuit 222. Only the ramp signal VRAMP is illustrated in FIG. 9B.

In a determination period Tj, the reference signal generation unit 30 outputs a second comparison voltage VREF2, which is lower than a first comparison voltage VREF. The comparator 221 compares the effective signal with a second comparison voltage VREF2, which is a second threshold. If it is determined that the effective signal is smaller than the second comparison voltage VREF2, the selection circuit 222 is made to supply the ramp signal L8 to the comparator 221 in the AD conversion period Tu. A signal indicating that the effective signal is smaller than the second comparison voltage VREF2 is stored in the flag memory 241.

Subsequently, the reference signal generation unit 30 outputs the first comparison voltage VREF. As a result of the comparison between the effective signal and the first comparison voltage VREF by the comparator 221, if it is determined that the effective signal is greater than the second comparison voltage VREF2 and is smaller than the first comparison voltage VREF, the selection circuit 222 is made to supply the ramp signal L to the comparator 221 in the AD conversion period Tu. A signal indicating that the effective signal is smaller than the first comparison voltage VREF is stored in the flag memory 241. If it is determined that the effective signal is greater than the first comparison voltage VREF, the selection circuit 222 is made to supply the ramp signal VH to the comparator 221 in the AD conversion period Tu. A signal indicating that the effective signal is greater than the first comparison voltage VREF is stored in the flag memory 241.

The AD conversion result obtained in the AD conversion period Tu is stored in the S memory 242 and is subject to difference processing between a signal stored in N memory 243 by the DSP or subject to signal processing, such as offset correction, gain correction, and gamma processing.

In the present embodiment, when the analog signal is smaller than the second threshold, which is lower than the first threshold, VREF, the analog signal is compared with the ramp signal L8 to obtain a p-bit digital signal.

Also in the present embodiment, it is desirable that the second comparison voltage VREF2 is set to be smaller than the maximum value of the ramp signal L2.

In the present embodiment, the number of bits of an analog signal that is a low luminance signal of which signal level is lower than the VL can be increased to (p+j) bits. Further, when an effective signal of which level is greater than the signal level VL is AD converted using the ramp signal VH, by lowering the operation frequency of the counter 40 as compared with a case in which AD conversion is performed using the ramp signal VL, power consumption can be reduced with the dynamic range unchanged.

The slope ratio error is described further.

FIG. 10 illustrates a waveform of a ramp signal in a case in which the ramp signal H has an error with respect to an ideal slope. The determination period Tj illustrated in the timing chart of FIG. 4 is not included in FIG. 10.

In FIG. 10, it is supposed that the ramp signal L used to AD convert a base signal has a slope k with respect to time. The period T1 is the period required to AD convert the base signal.

The ramp signal H' that is ideally used to AD convert the effective signal has a temporal change rate of a·k. An actual temporal change rate of the ramp signal H includes an error β with respect to an ideal value, and the temporal change rate herein is a·β·k. If an effective signal is AD converted using an ideal ramp signal H', time required for the AD conversion is T2'+T3'. If the effective signal is AD converted using an actual ramp signal H, time required for the AD conversion is T2+T3.

Since the slope ratio between the ramp signal L and the ramp signal H' is a, T1 is T1=a-T2'. When a difference process between an effective signal and a base signal is performed, a·(T2'+T3')−T1=a·T3' is obtained. However, when a difference process is performed between an effective signal obtained using an actual ramp signal H and a base signal, a(T2+T3)−T1= is obtained and an error is produced as compared with a case in which an ideal ramp signal H' is used. If the slope ratio error β is known previously, a correction can be performed by dividing (T2+T3) by β to obtain {a·(T2+T3)β}−T1=a·T3'.

A method for detecting the slope ratio error β is described. First, a·β, is obtained by obtaining a ratio between digital signals obtained by comparing effective signals of the same level of the ramp signal L and the ramp signal H. Then a·β is divided by a, which is the set slope ratio, to obtain a slope ratio error β.

The thus obtained slope ratio error β is stored in the slope ratio error detection unit 64 and may be used for signal correction. The slope ratio error may be detected at the time of manufacture. Alternatively, the slope ratio error in which an influence of, for example, temperature conditions at the time of image capturing is reflected may be detected before image capturing operation.

Fourth Embodiment

In the above-described embodiment, the effective signal is AD converted in comparison with a ramp signal in a ramp-based approximation method. In the present embodiment, an example in which an AD converter of a hybrid AD conversion system in which a successive approximation method and a ramp-based approximation method are combined is used is described.

Figure 11:
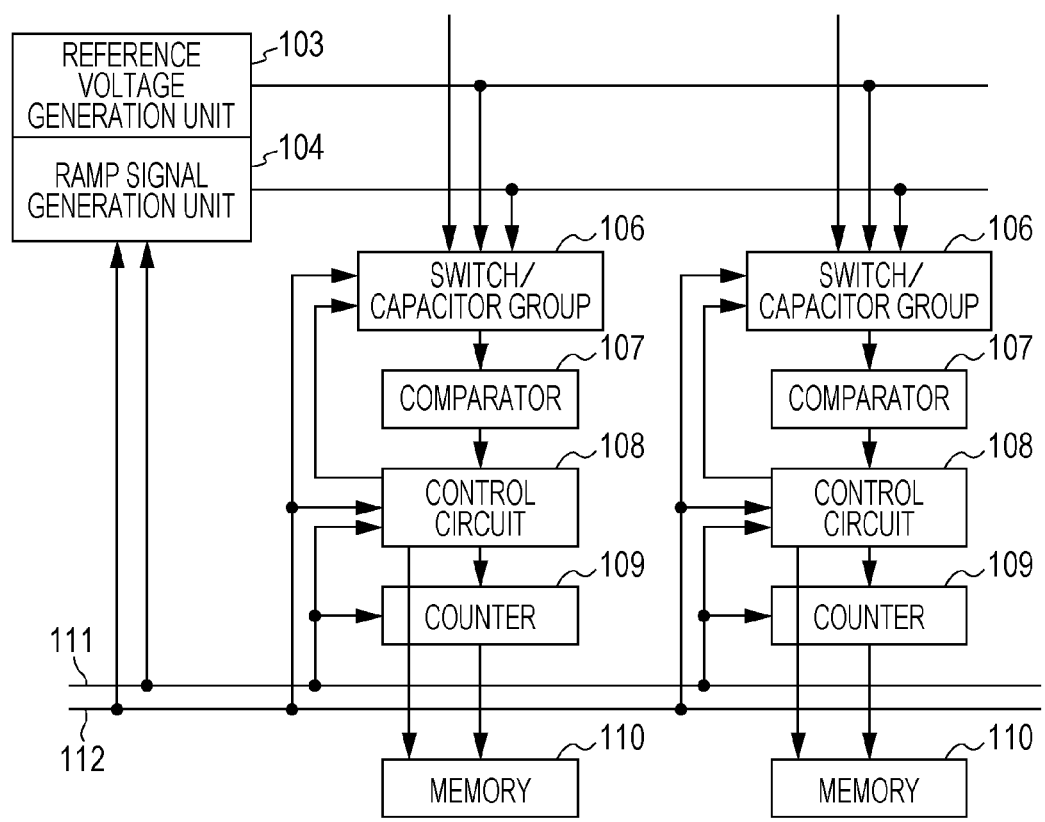
FIG. 11 is a diagram illustrating an exemplary configuration of a photoelectric conversion apparatus.

FIG. 11 is an exemplary configuration of a photoelectric conversion apparatus according to the present embodiment. The photoelectric conversion apparatus illustrated in FIG. 11 differs from the photoelectric conversion apparatus illustrated in FIG. 2 in the configuration of the column signal processing unit and in the configuration of the reference signal generation unit. Other configurations are the same as those illustrated in FIG. 2, and are not illustrated in FIG. 11.

The reference signal generation unit 30 in the present embodiment is provided with a reference voltage generation unit 103, in addition to a ramp signal generation unit 104.

The column signal processing unit 20 in the present embodiment is provided with a switch/capacitor group 106, a comparator 107, a control circuit 108, a counter 109, and a memory 110.

Figure 12:
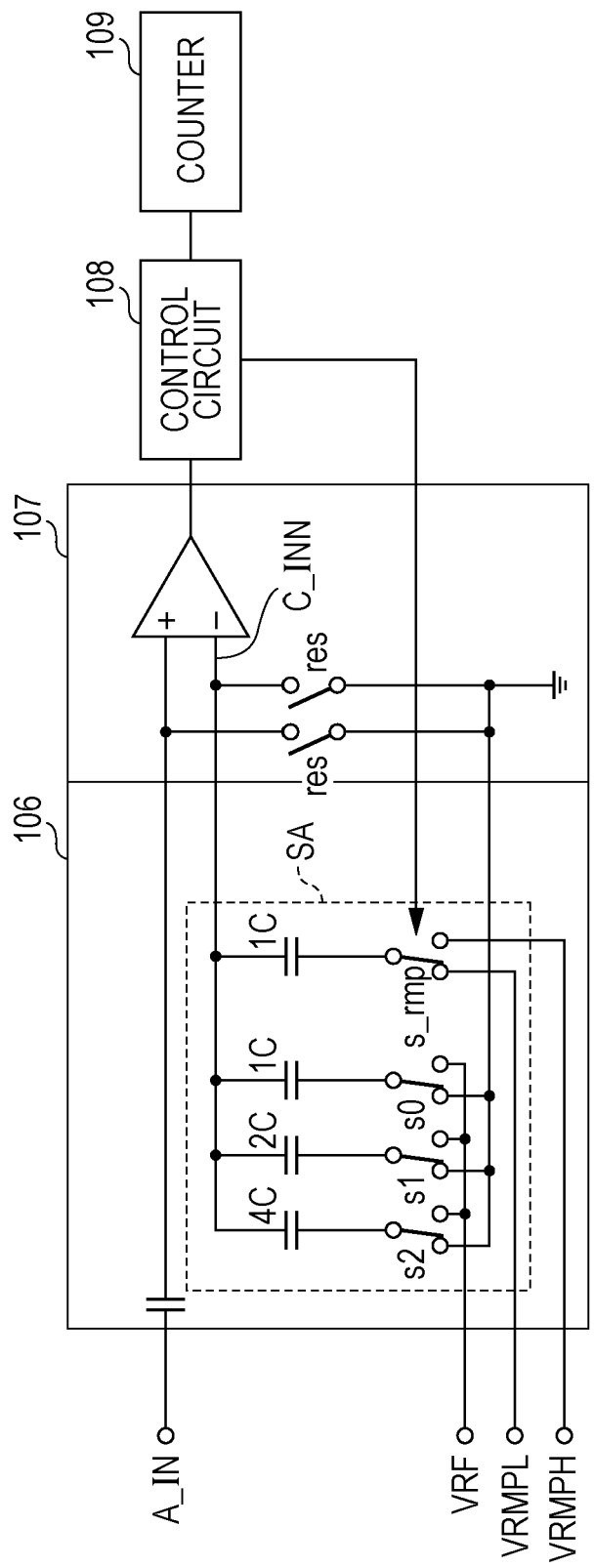
FIG. 12 is a detailed diagram illustrating an exemplary configuration of a column signal processing unit.

FIG. 12 illustrates a configuration of the column signal processing unit 20 in detail. The switch/capacitor group 106 includes a successive approximation capacitance unit SA and input capacitance Cin. Output from a pixel array 10 is supplied to a non-inversed input terminal of the comparator 107 via the input capacitance Cin.

In the successive approximation capacitance unit SA, capacitance elements of capacitance value 1C, 1C, 2C, and 4C are connected in parallel in the successive approximation capacitance unit SA. Therefore, binary weighting to the reference voltage VRF is possible. In the present embodiment, 2-bit successive approximation is implemented. A switch connected to each of the capacitance element of the capacitance value 1C, 2C, and 4C in series selectively connects corresponding capacitance element to the reference voltage VRF and the ground potential GND. The switch connected in series to the capacitance element of capacitance value 1C selectively supplies VRMPL, which is the ramp signal L, and VRMPH, which is the ramp signal H, to a corresponding capacitance element.

The comparator 107 has an input terminal that may reset to the ground potential GND, and has an output terminal that is connected to the control circuit 108.

The counter 109 operates under the control of the control circuit 108.

Figure 13A:
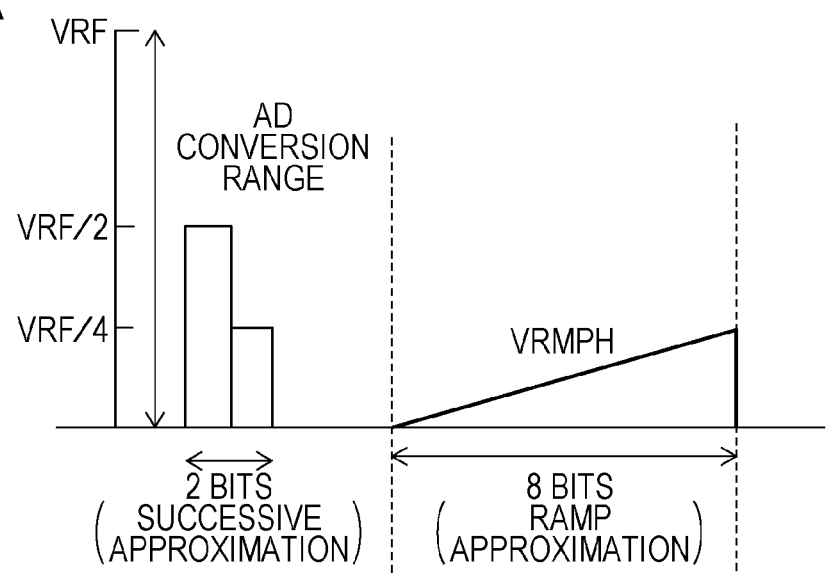
FIGS. 13A and 13B are diagrams for explaining an operation sequence of an image capturing system for ISO speeds 100 and 200, respectively.

FIG. 13A is a diagram for explaining an operation sequence in a case in which imaging sensitivity level of an image capturing system is ISO speed 100. FIG. 13A illustrates a signal supplied to the comparator 107 from the successive approximation parts SA. First, a voltage VRF/2 and a voltage VRF/4 are compared with an effective signal to AD convert the higher-order 2 bits of an effective signal. This operation is referred to as a first process. Then, a lower-order analog signal that corresponds to the least significant bit of the digital signal obtained in the first process is compared with a ramp signal VRMPH to AD convert the lower-order 8 bits. An AD conversion range in this case is 0 to VRF.

Figure 13B:
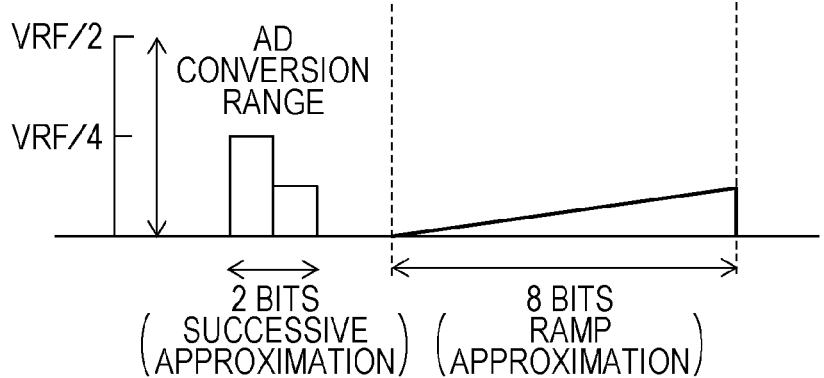

FIG. 13B is a diagram for explaining an operation sequence in a case in which imaging sensitivity level of the image capturing system is ISO speed 200. FIG. 13B differs from FIG. 13A in that a signal reference voltage for the comparison is VRF/4 and VRF/8 in the successive approximation operation and that a ramp signal VRMPL is used. However, if such a process is performed, the AD conversion range in ISO speed 200 becomes the half of that in ISO speed 100.

Next, an operation according to the present embodiment is described.

Figure 14:
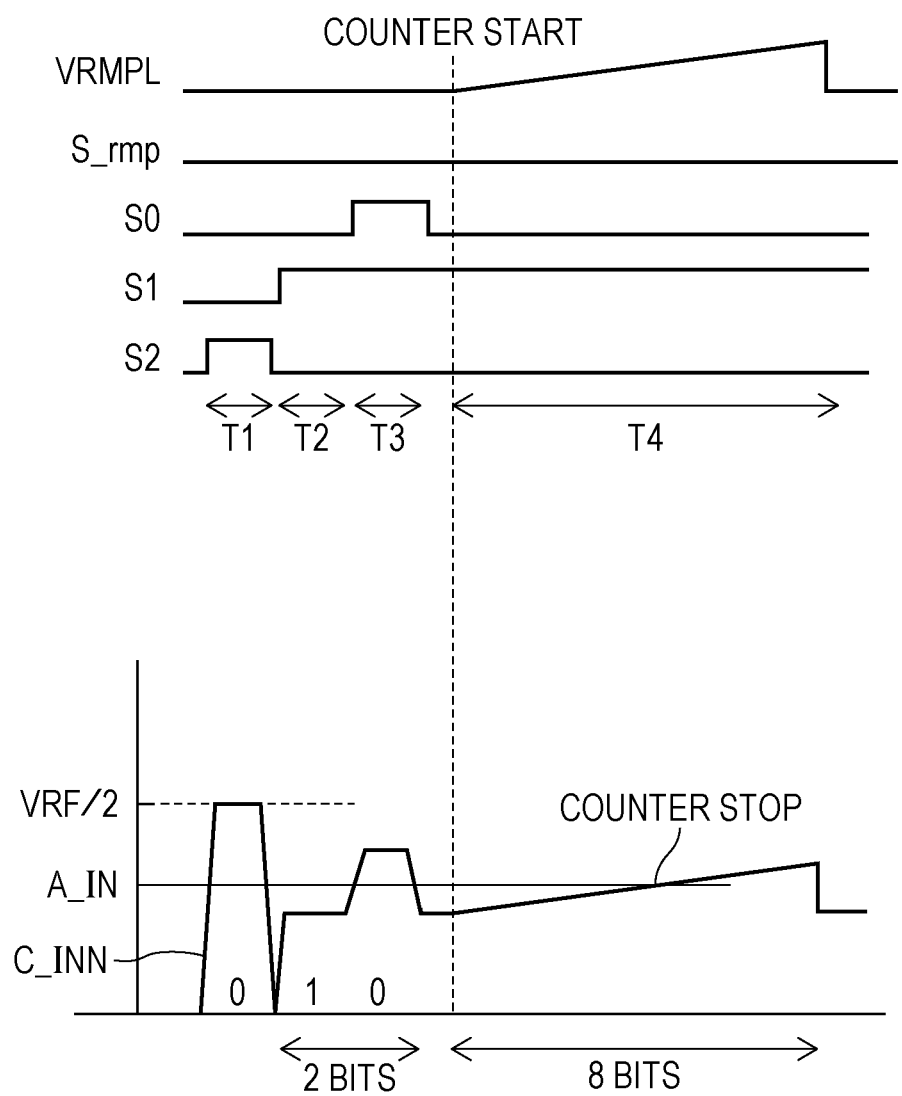
FIG. 14 is a diagram for explaining an operation.

FIG. 14 is a timing chart for explaining an operation in a case in which an effective signal is a low luminance signal, which is smaller than VRF/2 (A_IN<VRF/2) in ISO speed 200. When signals S0 to S1 are on an H level, each corresponding switch supplies a reference voltage VRF to a corresponding capacitance element. When signals S0 to S1 are on a low level, each corresponding switch supplies a ground potential GND.

In periods T1 to T3, an effective signal is AD converted by a 2-bit successive approximation method. In the period T1, it is determined that the effective signal is greater or smaller than voltage VRF/2 and, in the periods T2 and T3, in accordance with the determination result, a voltage to be used in comparison with the effective signal is determined. In FIG. 14, "10" is obtained as a digital code. Since it is shown that A_IN<VRF/2 from the determination result in the period T1, The control circuit 108 controls the switch so that the ramp signal VRMPL is supplied to the capacitance element of the capacitance value 1C. Thus, in period T4, 8 bits are AD converted by using a ramp signal VRMPL of which temporal change rate is relatively low.

Figure 15:
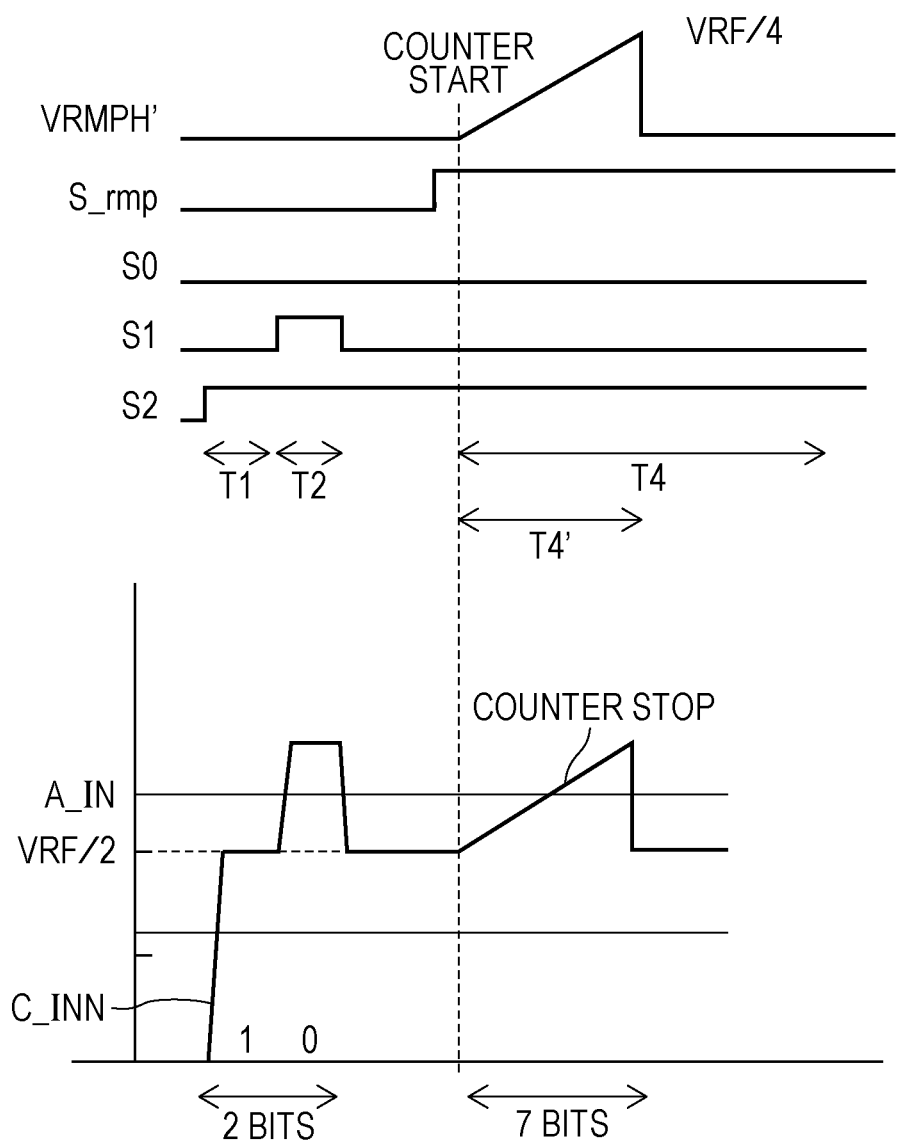
FIG. 15 is a diagram for explaining an operation.

FIG. 15 is a timing chart for explaining an operation in a case in which an imaging sensitivity level is similarly ISO speed 200 but an effective signal is a high luminance signal, which exceeds VRF/2 (A_IN>VRF/2).

In this case, after 2 bits are AD converted by the successive approximation method, 7 bits are AD converted using a ramp signal VRMPH of which temporal change rate is relatively high. When 7 bits are AD converted, as described in each embodiment above, power consumption can be reduced while extending the dynamic range by, for example, changing an operation frequency of the counter 109 or changing a period in which the ramp signal indicates temporal change. Further, an effective signal in the range of VRF/2 to VRF can also be AD converted that cannot be AD converted in the case of FIG. 13B.

Fifth Embodiment

In each embodiment described above, a gain to the signal is increased by lowering the temporal change rate of the ramp signal. Actually, however, there is noise caused by the comparator or the reference signal generation unit and, therefore, if the temporal change rate of the ramp signal is low, discrimination between the effective signal and noise may become impossible.

Then, in the present embodiment, an amplifier is provided in an analog signal processing unit to reduce an influence of noise.

Figure 16:
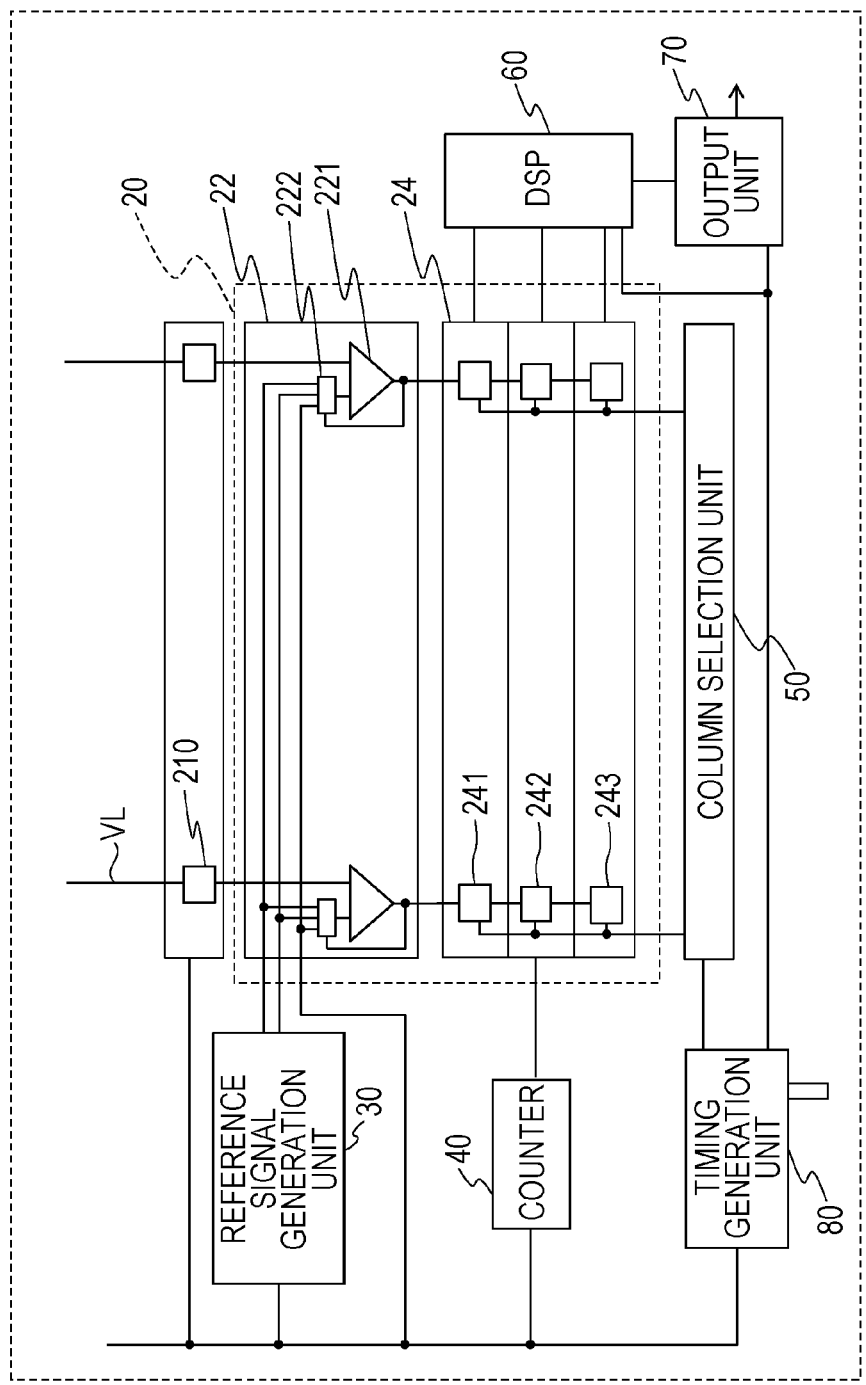
FIG. 16 is a diagram illustrating an exemplary configuration of a photoelectric conversion apparatus.

FIG. 16 is a diagram illustrating an exemplary configuration of a photoelectric conversion apparatus according to the present embodiment. FIG. 16 differs from FIG. 2 in that an amplifier circuit 210 is provided in each column of the pixel array 10.

Figure 17:
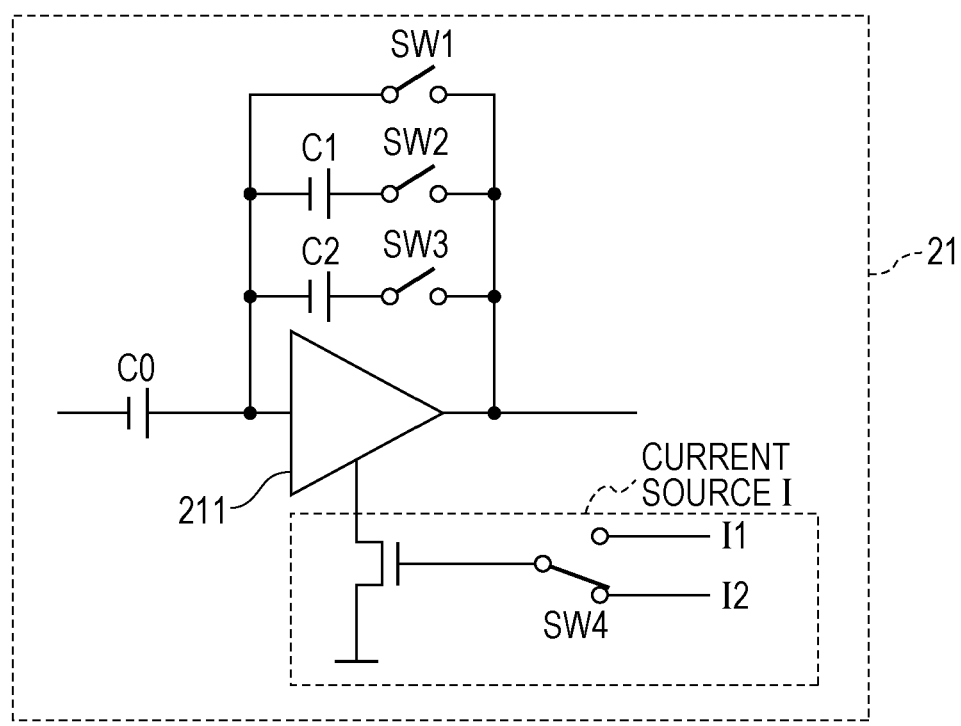
FIG. 17 is a diagram illustrating an exemplary configuration of an amplifier circuit.

A configuration of the amplifier circuit 210 is illustrated in FIG. 17 in detail. The amplifier circuit 210 is provided with a differential amplifier 211, input capacitance C0, feedback capacitance C1, feedback capacitance C2, switches SW1, SW2 and SW3, and a current source I that supplies a current to the differential amplifier 211. The current source I is a variable current source that can switch the current supplied to the differential amplifier 211 between I1 and I2. Here, it is supposed that I2=I1/2. Switches SW1 to SW4 are controlled by the timing generation unit 80. An amplification factor of the amplifier circuit 210 is determined based on a ratio between a capacitance value of active feedback capacitance on a feedback path of the differential amplifier 211 and a capacitance value of the input capacitance C0. The amplifier circuit 210 can be operated as a clamp circuit by a known method and, therefore, a signal obtained by reducing the base signal from the effective signal can be amplified.

Usually, when the ISO speed of the photoelectric conversion apparatus is changed, the amplification factor of the amplifier circuit is also switched. In that case, the dynamic range is narrowed. In the present embodiment, the dynamic range is extended by setting the range of the amplification factor based on the ISO speed to be small, and changing the temporal change rate of the ramp signal.

Figure 18:
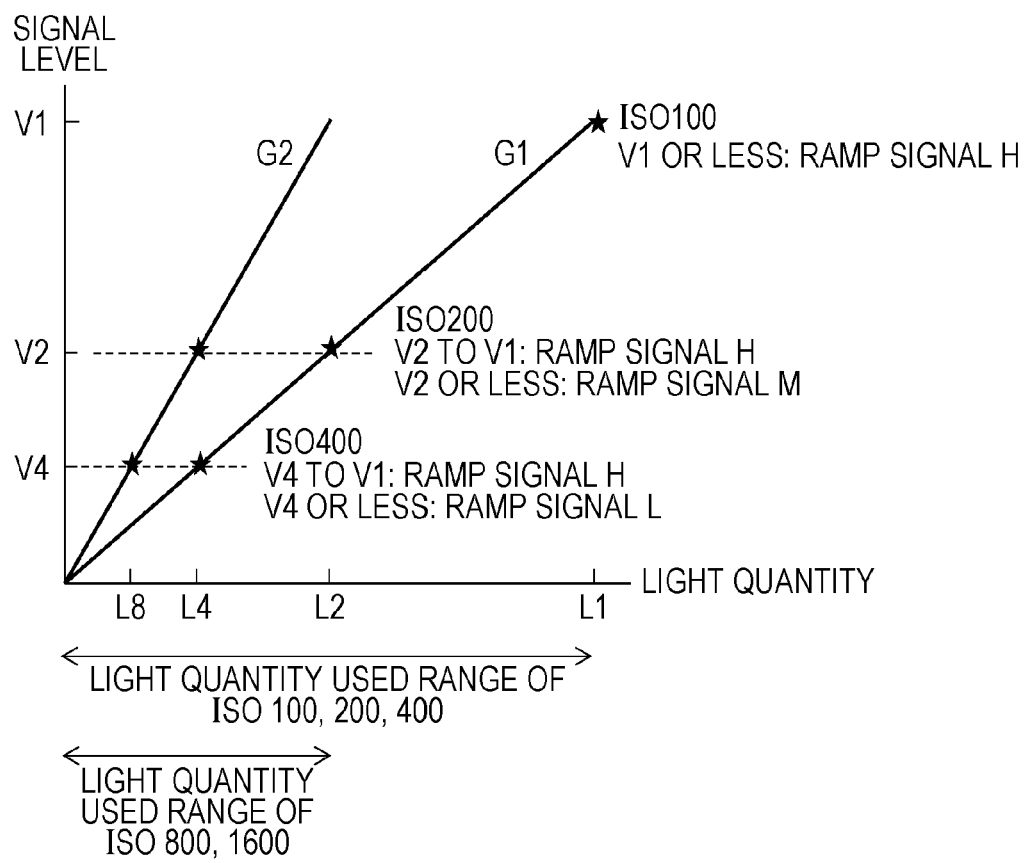
FIGS. 18A and 18B are diagrams illustrating relationships among imaging sensitivity, an amplification factor of an amplifier circuit, and a ramp signal.

FIG. 18A is a table illustrating relationships among the ISO speed, the amplification factor (i.e., an amplifier gain) of the amplifier circuit, and the ramp signals in the present embodiment. In the present embodiment, in a case in which the ISO speed is 100, 200, and 400, the amplifier gain is fixed to 1 time, and the combination of the ramp signals to be used for the AD conversion is changed. Similarly, in a case in which the ISO speed is 800 and 1600, the amplifier gain is fixed twice, and the combination of the ramp signals to be used for the AD conversion is changed. Since the combination of the ramp signals are the same as those described with reference to FIG. 7, description thereof is omitted.

FIG. 18B illustrates a relationship between an incident light quantity to the photoelectric conversion apparatus and a signal level corresponding to the incident light quantity. When the ISO speed is 100, 200, and 400, the amplifier gain is G1=1 and, therefore, an incident light quantity of 0 to L1 can be accepted. When the ISO speed is 800 and 1600, the amplifier gain is G2=2 and, therefore, an incident light quantity of 0 to L2 (=L1/2) can be accepted.

When the ISO speed is 100, AD conversion is performed only using the ramp signal H. When the ISO speed is 200, the signal in the range of 0 to V2 is AD converted using the ramp signal M, and the signal in the range of V2 to V1 is AD converted using the ramp signal H. Similarly, when the ISO speed is 400, the signal in the range of 0 to V4 is AD converted using the ramp signal L, and the signal in the range of V4 to V1 is AD converted using the ramp signal H.

Also in the present embodiment, power consumption can be reduced while extending the dynamic range.

A consumed current in the amplifier circuit may be changed in accordance with the operation mode of the image capturing system. In particular, in a moving image capturing mode, a current I2 is supplied to the differential amplifier to reduce driving ability of the amplifier circuit and, in a still image capturing mode, a current I1 is supplied to the differential amplifier.

Sixth Embodiment

Figure 19:
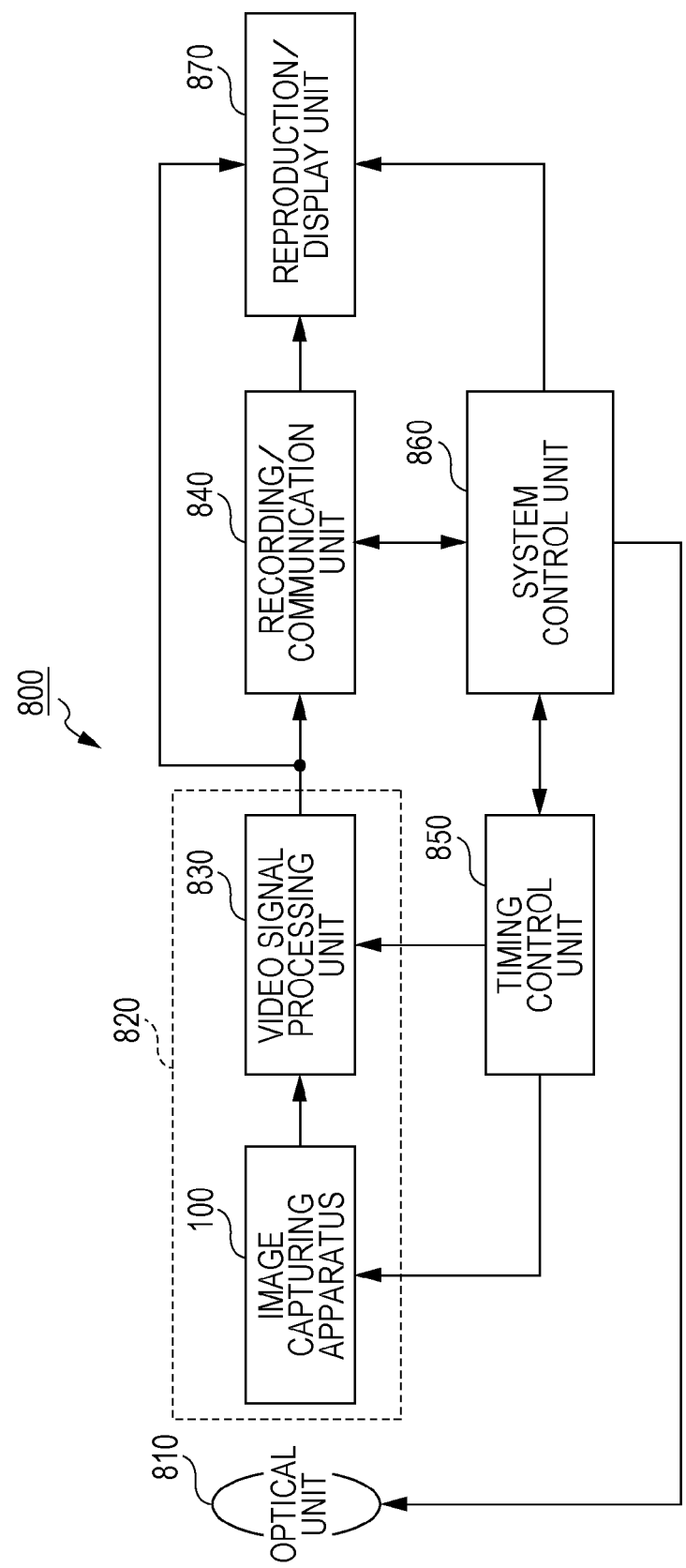
FIG. 19 is a diagram illustrating an exemplary configuration of an image capturing system.

FIG. 19 is a diagram illustrating an exemplary configuration of an image capturing system according to the present embodiment. An image capturing system 800 is provided with, for example, an optical unit 810, an image capturing element 100, a video signal processing unit 830, a recording/communication unit 840, a timing control unit 850, a system control unit 860, and a reproduction/display unit 870. An image capturing apparatus 820 is provided with the image capturing element 100 and the video signal processing unit 830. The photoelectric conversion apparatus described in the previous embodiments is used as the image capturing element 100.

The optical unit 810, which is, for example, an optical system such as a lens, images a light beam from a subject in the pixel array 10 in which a plurality of pixels are arranged in two dimensional array and forms an image of the subject in the image capturing element 100. The image capturing element 100 outputs a signal in accordance with the light imaged in the pixel array 10 at a timing based on a signal from the timing control unit 850. The signal output from the image capturing element 100 is input in the video signal processing unit 830, which is a video signal processing unit, and the video signal processing unit 830 performs signal processing in accordance with a method defined by, for example, a program. The signal obtained by the process in the video signal processing unit 830 is sent to the recording/communication unit 840 as image data. The recording/communication unit 840 sends a signal for forming an image to the reproduction/display unit 870, and makes the reproduction/display unit 870 reproduce and display a moving image and a still image. In response to the signal from the video signal processing unit 830, the recording/communication unit 840 communicates with the system control unit 860 and records, on an unillustrated recording medium, the signal for forming an image.

The system control unit 860 collectively controls an operation of the image capturing system, and controls driving of the optical unit 810, the timing control unit 850, the recording/communication unit 840, and the reproduction/display unit 870. The system control unit 860 is provided with an unillustrated storage device, which is, for example, a recording medium. Programs and the like necessary to control the operation of the image capturing system are recorded in the storage device. The system control unit 860 supplies, to the image capturing system, a signal for switching driving modes and sensitivity levels in accordance with, for example, a user operation. Specific examples include a change in a line on which reading is started, a change in a line on which reset is made, a change in an angle of view as a result of electronic zooming, and a shift of an angle of view as a result of electronic image stabilization. When the sensitivity level of the image capturing system is switched in accordance with the user input, the sensitivity level of the image capturing element 100 is also switched in accordance with the switching. That is, the system control unit 860 has a function as a sensitivity selection unit that selects the sensitivity level of the image capturing system 800, and the sensitivity level of the image capturing element 100 is switched in accordance with the selected sensitivity level.

The timing control unit 850 controls driving timing of the image capturing element 100 and the driving timing of the video signal processing unit 830 under the control of the system control unit 860. The timing control unit 850 may function as a sensitivity setting unit that sets the imaging sensitivity level of the image capturing element 100.

Other Embodiments

Each of the above embodiments is illustrated for the implementation and can be modified without departing from the technical idea of the disclosure, and elements of a plurality of embodiments can be combined.

For example, the ramp signal of which signal level changes in the shape of a slope with respect to time has been described in each of the above embodiments, but the ramp signal may change in steps with respect to time.

ADVANTAGEOUS EFFECTS

According to the disclosure, narrowing of the dynamic range upon switching of sensitivity levels can be reduced.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-035848, filed Feb. 26, 2014 which is hereby incorporated by reference herein in its entirety.

What is claimed is:

1. A photoelectric conversion apparatus comprising:
   a plurality of pixels;
   a plurality of analog signal output units each configured to output an analog signal in accordance with a signal which is produced by and is output from a corresponding one of the plurality of pixels; and
   a plurality of analog-to-digital (AD) converters provided to correspond to the plurality of analog signal output units and each configured to perform AD conversion by comparing a ramp signal with the analog signal output from a corresponding one of the analog signal output units, wherein
   the photoelectric conversion apparatus has a first operation mode where the imaging sensitivity level is a first sensitivity level and a second mode where the imaging sensitivity level is a second sensitivity level different from the first sensitivity level,
   in the first operation mode,
   each of the plurality of AD converters uses a first ramp signal having a first slope to perform the AD conversion for the analog signal having a first signal level lower than a threshold value, and uses a second ramp signal having a second slope steeper than the first slope to perform the AD conversion for the analog signal having a second signal level higher than a threshold value, and
   in the second operation mode,
   each of the plurality of AD converters uses a third ramp signal having a third slope for both of the analog signal having the first signal level lower than the threshold value and the analog signal having the second signal level higher than the threshold value.

2. The photoelectric conversion apparatus according to claim 1, wherein
   the second sensitivity level is higher than the first sensitivity level, and
   the third slope defined as a rate of change of the third ramp signal is equal to the first slope defined as a rate of change of the first ramp signal, or is less than the first slope.

3. The photoelectric conversion apparatus according to claim 2, wherein
   the second sensitivity level is n times as high as the first sensitivity level, and
   the rate of change of the third ramp signal is 1/n times as high as the rate of change of the first ramp signal.

4. The photoelectric conversion apparatus according to claim 2, wherein
   the second sensitivity level is n times as high as the first sensitivity level,
   the third slope is equal to the first slope, and
   the rate of change of the first ramp signal is 1/n times as high as a rate of change of the second ramp signal which defines the second slope.

5. The photoelectric conversion apparatus according to claim 1, wherein
   the second sensitivity level is lower than the first sensitivity level, and
   the third slope defined as a rate of change of the third ramp signal is equal to the second slope defined as a rate of change of the second ramp signal, or is steeper than the second slope.

6. The photoelectric conversion apparatus according to claim 5, wherein
   the second sensitivity level is 1/n times as high as the first sensitivity level, and
   the rate of change of the third ramp signal is n times as high as the rate of change of the second ramp signal.

7. The photoelectric conversion apparatus according to claim 5, wherein
   the second sensitivity level is 1/n times as high as the first sensitivity level,
   the third slope is equal to the second slope, and
   the rate of change of the second ramp signal is n times as high as a rate of change of the first ramp signal which defines the first slope.

8. The photoelectric conversion apparatus according to claim 1, wherein
in the first operation mode,
when the level of the analog signal is lower than the threshold value, the AD converter converts the analog signal into a p-bit digital signal, and
when the level of the analog signal is higher than the threshold value, the AD converter converts the analog signal into a q-bit digital signal, the q-bit being different from the p-bit.

9. The photoelectric conversion apparatus according to claim 8, wherein each of the plurality of AD converters further includes:
a counter configured to count a clock signal and output a count signal; and
a memory configured to store the count signal in accordance with a change in the magnitude relationship between the analog signal and the ramp signal, and
the clock signal has
a lower frequency when converting the analog signal into the q-bit digital signal than when converting the analog signal into the p-bit digital signal.

10. The photoelectric conversion apparatus according to claim 1, wherein each of the plurality of AD converters AD converts the analog signal by a successive approximation method, and AD converts, using the ramp signal, the lower-order analog signal equivalent to the least significant bit of the digital signal obtained by the AD conversion of the successive approximation method.

11. The photoelectric conversion apparatus according to claim 1, further comprising a correcting unit configured to correct an error in the rates of change of the first ramp signal and the second ramp signal.

12. The photoelectric conversion apparatus according to claim 1, wherein the second ramp signal keep changing for a period longer than a period during which the first ramp signal changes.

13. The photoelectric conversion apparatus according to claim 1, wherein
in the first operation mode, the photoelectric conversion apparatus has a first amplification factor, and
in the second operation mode, the photoelectric conversion apparatus has a second amplification factor different from the first amplification factor.

14. An image capturing system, comprising:
the photoelectric conversion apparatus according to claim 1;
an optical system configured to form an image in a plurality of pixels; and
a video signal processing unit configured to process a signal output from the photoelectric conversion apparatus, and generates image data.

15. The image capturing system according to claim 14, further comprising
a sensitivity selection unit, wherein
a sensitivity level of the photoelectric conversion apparatus is selected by the sensitivity selection unit.

16. A photoelectric conversion apparatus comprising:
a plurality of pixels;
a plurality of analog signal output units each configured to output an analog signal in accordance with a signal which is produced by and is output from a corresponding one of the plurality of pixels;
a plurality of comparators provided to correspond to the plurality of analog signal output units; and
a ramp signal supply unit, wherein
the photoelectric conversion apparatus has a first operation mode where the imaging sensitivity level is a first sensitivity level and a second mode where the imaging sensitivity level is a second sensitivity level different from the first sensitivity level
in the first operation mode,
the ramp signal supply unit supplies a first ramp signal having a first slope in response to an input of the analog signal having a first signal level lower than a threshold value into the comparator, and supplies a second ramp signal having a second slope steeper than the first slope in response to an input of the analog signal having a second signal level higher than a threshold value into the comparator, and
in the second operation mode, the ramp signal supply unit supplies a third ramp signal having a third slope in response to each of input of the analog signal having the first signal level lower than the threshold value and an input of the analog signal having the second signal level higher than the threshold value.

17. The photoelectric conversion apparatus according to claim 16, wherein
in the first operation mode, the photoelectric conversion apparatus has a first amplification factor, and
in the second operation mode, the photoelectric conversion apparatus has a second amplification factor different from the first amplification factor.

* * * * *